(12) United States Patent
Kang et al.

(10) Patent No.: US 11,626,564 B2
(45) Date of Patent: Apr. 11, 2023

(54) ORGANIC ELECTROLUMINESCENCE DEVICE AND ORGANOMETALLIC COMPOUND FOR ORGANIC ELECTROLUMINESCENCE DEVICE

(71) Applicant: Samsung Display Co., Ltd., Yongin-si (KR)

(72) Inventors: Sunwoo Kang, Hwaseong-si (KR); Sunmi Choi, Hwaseong-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 320 days.

(21) Appl. No.: 16/938,702

(22) Filed: Jul. 24, 2020

(65) Prior Publication Data

US 2021/0119152 A1 Apr. 22, 2021

(30) Foreign Application Priority Data

Oct. 21, 2019 (KR) .................. 10-2019-0130478

(51) Int. Cl.
*C09K 11/06* (2006.01)
*H01L 51/00* (2006.01)
(Continued)

(52) U.S. Cl.
CPC ...... *H01L 51/0087* (2013.01); *C07F 15/0033* (2013.01); *C07F 15/0086* (2013.01);
(Continued)

(58) Field of Classification Search
CPC .................. C07F 15/0033; C07F 15/004; C07F 15/0006; C07F 15/0013
(Continued)

(56) References Cited

U.S. PATENT DOCUMENTS 8,674,141 B2 3/2014 Stoessel et al.
9,673,409 B2 6/2017 Li et al.
(Continued)

FOREIGN PATENT DOCUMENTS

KR 10-1289923 B1 7/2013
KR 10-2014-0144152 A 12/2014
(Continued)

OTHER PUBLICATIONS

Braunschweig Holger et al., "Synthesis of η1-borazine complexes of palladium and platinum," The Royal Society of Chemistry; Dalton Trans., 2008; pp. 3531-3534.

*Primary Examiner* — Christopher M Raabe
(74) *Attorney, Agent, or Firm* — Lewis Roca Rothgerber Christie LLP

(57) ABSTRACT

The present disclosure relates to an organic electroluminescence device including an organometallic compound represented by Formula 1 or Formula 2 below in an emission layer, to achieve long service life of the organic electroluminescence device.

(Continued)

Formula 1

Formula 2

22 Claims, 2 Drawing Sheets

(51) Int. Cl.
*C07F 15/00* (2006.01)
*C09K 11/02* (2006.01)
*H01L 51/50* (2006.01)

(52) U.S. Cl.
CPC .............. *C09K 11/02* (2013.01); *C09K 11/06* (2013.01); *H01L 51/0085* (2013.01); *C09K 2211/1007* (2013.01); *C09K 2211/107* (2013.01); *C09K 2211/1014* (2013.01); *C09K 2211/1022* (2013.01); *C09K 2211/1029* (2013.01); *C09K 2211/1044* (2013.01); *C09K 2211/185* (2013.01); *H01L 51/5004* (2013.01); *H01L 51/5012* (2013.01); *H01L 2251/552* (2013.01)

(58) Field of Classification Search
USPC ........................................................... 257/40
See application file for complete search history.

(56) References Cited

U.S. PATENT DOCUMENTS

| | | | | |
|---|---|---|---|---|
| 10,964,904 | B2* | 3/2021 | Fitzgerald | ........... H01L 51/5221 |
| 2018/0261793 | A1* | 9/2018 | Fitzgerald | ........... H01L 51/5096 |
| 2019/0322689 | A1 | 10/2019 | Kang et al. | |
| 2021/0359227 | A1* | 11/2021 | Shin | ..................... H01L 51/0073 |

FOREIGN PATENT DOCUMENTS

| | | |
|---|---|---|
| KR | 10-2018-0086155 A | 7/2018 |
| KR | 10-2019-0122922 A | 10/2019 |
| KR | 10-2020-0021870 A | 3/2020 |
| KR | 10-2020-0062022 A | 6/2020 |

\* cited by examiner

ORGANIC ELECTROLUMINESCENCE DEVICE AND ORGANOMETALLIC COMPOUND FOR ORGANIC ELECTROLUMINESCENCE DEVICE

CROSS-REFERENCE TO RELATED APPLICATIONS

This application claims priority to and the benefit of Korean Patent Application No. 10-2019-0130478, filed on Oct. 21, 2019, the entire content of which is hereby incorporated by reference.

BACKGROUND

1. Field

One or more aspects of embodiments of the present disclosure herein relate to an organic electroluminescence device and an organometallic compound used therein.

2. Description of the Related Art

The development of an organic electroluminescence display as an image display is being actively conducted. The organic electroluminescence display is a self-luminescent display in which holes and electrons injected from a first electrode and a second electrode recombine in an emission layer to thus emit light from a luminous material, which is an organic compound contained in the emission layer.

For example, an organic device which includes a first electrode, a hole transport layer on the first electrode, an emission layer on the hole transport layer, an electron transport layer on the emission layer, and a second electrode on the electron transport layer is known as an organic electroluminescence display device. Holes are injected from the first electrode, and the injected holes are moved through the hole transport layer and injected into the emission layer. Meanwhile, electrons are injected from the second electrode, and the injected electrons are moved through the electron transport layer and injected into the emission layer. The holes and electrons injected into the emission layer are combined to form excitons in the emission layer. The organic electroluminescence display emits light with light generated when the excitons return to a ground state.

In the application of an organic electroluminescence device to a display, long life (lifespan) of the organic electroluminescence device is required (or desired), and development of materials for the organic electroluminescence device which is capable of stably (or suitably) attaining these characteristics is being continuously required.

SUMMARY

One or more aspects of embodiments of the present disclosure herein are directed toward an organic electroluminescence device and an organometallic compound used therein.

An embodiment of the present disclosure provides an organic electroluminescence device including a first electrode, a hole transport region on the first electrode, an emission layer on the hole transport region, an electron transport region on the emission layer, and a second electrode on the electron transport region. The emission layer includes an organometallic compound containing a metal atom and a ligand linked with the metal atom. The ligand includes at least one substituted or unsubstituted borazine group which is directly linked to the metal atom. The ligand may include at least one selected from a substituted or unsubstituted aryl group having 6 to 30 carbon atoms for forming a ring, and a substituted or unsubstituted heteroaryl group having 1 to 30 carbon atoms for forming a ring group.

The metal atom may be a platinum (Pt) atom, an iridium (Ir) atom, a palladium (Pd) atom, or an osmium (Os) atom.

The metal atom may be a platinum atom, and the ligand may be a tetradentate ligand. The metal atom may be an iridium atom, and the ligand may include two tridentate ligands or one hexadentate ligand.

The aryl group may be a substituted or unsubstituted benzene derivative, and the heteroaryl group may be a substituted or unsubstituted aromatic carbene derivative.

The emission layer may emit light having a center wavelength of about 420 nm to about 470 nm via phosphorescence luminescence.

The emission layer may include a host and a dopant. The dopant may include the organometallic compound.

The difference ($\Delta(T_1-{}^3MC)$) between $T_1$ energy level and ${}^3MC$ energy level of the organometallic compound may be about 0.3 eV or more.

The organometallic compound may be represented by Formula 1 or Formula 2 below:

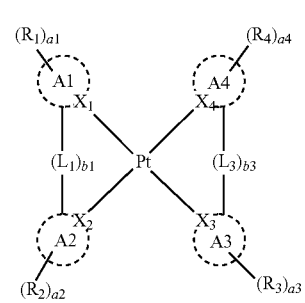

Formula 1

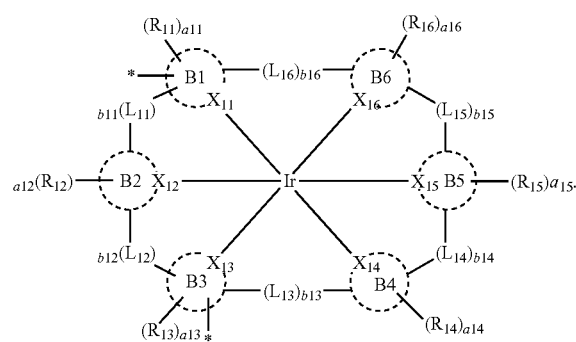

Formula 2

In Formula 1 and Formula 2, $X_1$ to $X_4$, and $X_{11}$ to $X_{16}$ may be each independently a carbon atom or a nitrogen atom. A1 to A4 and B1 to B6 may be each independently a substituted or unsubstituted aryl group having 6 to 30 carbon atoms for forming a ring, or a substituted or unsubstituted heteroaryl group having 1 to 30 carbon atoms for forming a ring. At least one selected from A1 to A4, and at least one selected from B1 to B6, may be a substituted or unsubstituted borazine group. $R_1$ to $R_4$ and $R_{11}$ to $R_{16}$ may be each independently a hydrogen atom, a deuterium atom, a substituted or unsubstituted alkyl group having 1 to 20 carbon atoms, a substituted or unsubstituted aryl group having 6 to 30 carbon atoms for forming a ring, or a substituted or unsubstituted heteroaryl group having 1 to 30 carbon atoms for forming a ring, and any of $R_1$ to $R_4$ and $R_{11}$ to $R_{16}$ may be combined with an adjacent group to form a ring. a1 to a4 and a11 to a16 may be each independently an integer of 0 to 3. $L_1$ to $L_3$ and $L_{11}$ to $L_{16}$ may be each independently a direct linkage, *—O—*, *—S—*, a substituted or unsubstituted divalent alkyl group having 1 to 20 carbon atoms, a substituted or unsubstituted arylene group having 6 to 30 carbon atoms for forming a ring, or a substituted or unsubstituted heteroarylene group having 1 to 30 carbon atoms for forming a ring. b1 to b3, and b11 to b16 may be each independently 0 or 1. In Formula 2 above, B1, B3, and B5 may be optionally linked to a linker represented by Formula 2A below:

Formula 2A

In Formula 2A above, $L_{31}$ may be a nitrogen atom, a substituted or unsubstituted trivalent alkyl group having 1 to 20 carbon atoms, a substituted or unsubstituted trivalent aryl group having 6 to 30 carbon atoms for forming a ring, or a substituted or unsubstituted trivalent heteroaryl group having 1 to 30 carbon atoms for forming a ring. c may be 0 or 1.

A1 to A4 and B1 to B6 may be each independently any one selected from LG1 to LG3.

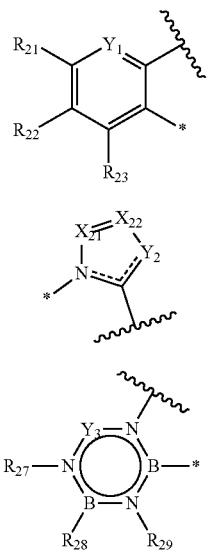

LG1

LG2

LG3

In LG1 to LG3, $X_{21}$ and $X_{22}$ may be each independently $CR_{24}$, or a nitrogen atom. $Y_1$ may be $CR_{25}$ or C—*. $Y_2$ may be $NR_{26}$ or N—. $Y_3$ may be B or B—*. $R_{21}$ to $R_{29}$ may be each independently a hydrogen atom, a deuterium atom, a substituted or unsubstituted alkyl group having 1 to 20 carbon atoms, a substituted or unsubstituted aryl group having 6 to 30 carbon atoms for forming a ring, or a substituted or unsubstituted heteroaryl group having 1 to 30 carbon atoms for forming a ring, and any of $R_{21}$ to $R_{29}$ may be combined with an adjacent group to form a ring.

Formula 1 above may be represented by Formula 1-1 below:

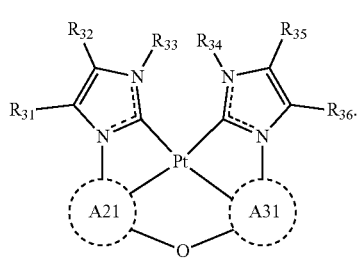

Formula 1-1

In Formula 1-1 above, A21 and A31 may be each independently LG1 or LG3, and at least one selected from A21 and A31 may be LG3. $R_{31}$ to $R_{36}$ may be each independently a hydrogen atom, a deuterium atom, a substituted or unsubstituted alkyl group having 1 to 20 carbon atoms, a substituted or unsubstituted aryl group having 6 to 30 carbon atoms for forming a ring, or a substituted or unsubstituted heteroaryl group having 1 to 30 carbon atoms for forming a ring, and any of $R_{31}$ to $R_{36}$ may be combined with an adjacent group to form a ring.

Formula 2 above may be represented by Formula 2-1 or Formula 2-2 below:

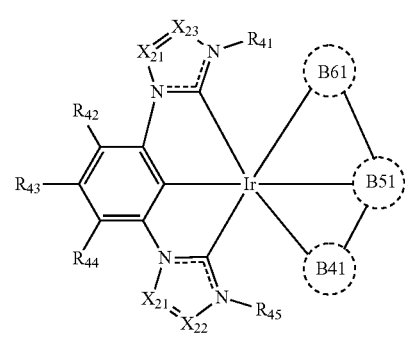

Formula 2-1

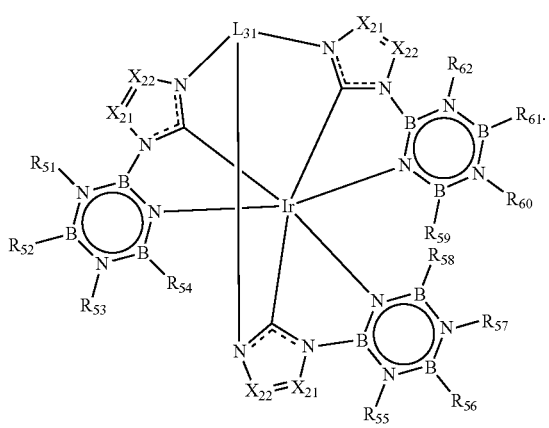

Formula 2-2

In Formula 2-1 and Formula 2-2 above, B41 to B61 may be each independently LG1, LG2, or LG3, and at least one selected from B41 to B61 may be LG3.

$R_{41}$ to $R_{45}$ may be each independently a hydrogen atom, a deuterium atom, a substituted or unsubstituted alkyl group having 1 to 20 carbon atoms, a substituted or unsubstituted aryl group having 6 to 30 carbon atoms for forming a ring, or a substituted or unsubstituted heteroaryl group having 1 to 30 carbon atoms for forming a ring, and any of $R_{41}$ to $R_{45}$ may be combined with an adjacent group to form a ring.

$R_{51}$ to $R_{62}$ may be each independently a hydrogen atom, a deuterium atom, a substituted or unsubstituted alkyl group having 1 to 20 carbon atoms, a substituted or unsubstituted aryl group having 6 to 30 carbon atoms for forming a ring, or a substituted or unsubstituted heteroaryl group having 1 to 30 carbon atoms for forming a ring, and any of $R_{51}$ to $R_{62}$ may be combined with an adjacent group to form a ring.

$L_{31}$ may be the same as defined in Formula 2A above, and $X_{21}$ and $X_{22}$ may be the same as defined in LG2.

The emission layer may include at least one selected from the compounds represented by Compound Group 1 below:

Compound Group 1

1
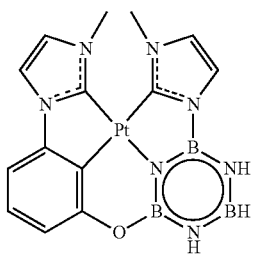

2
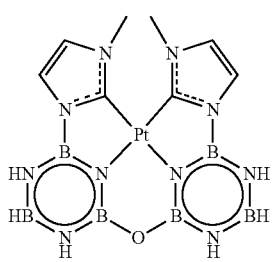

3
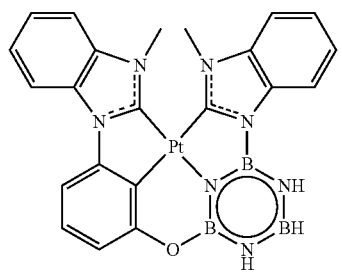

4
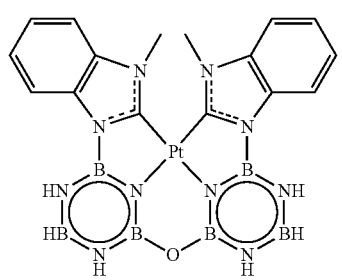

5
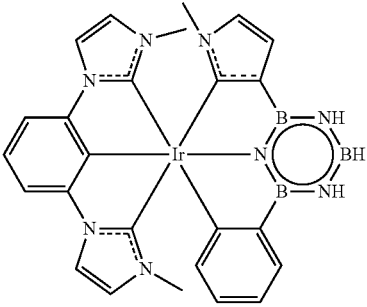

6
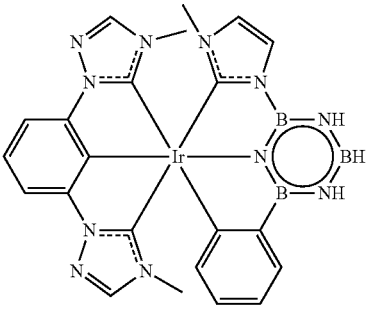

7
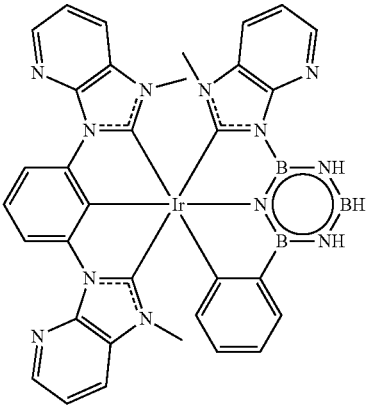

8
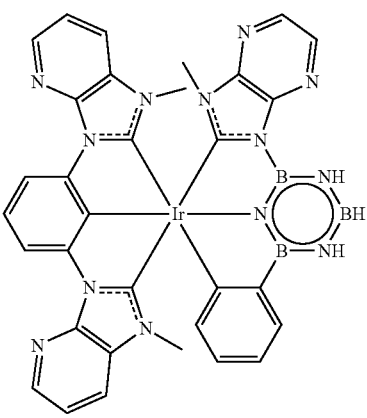

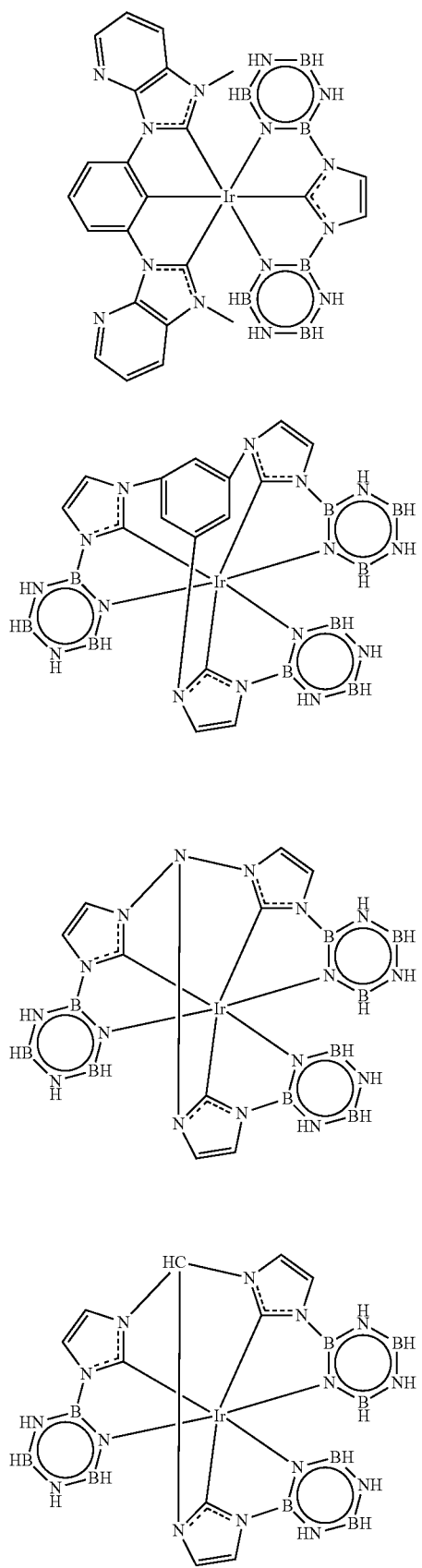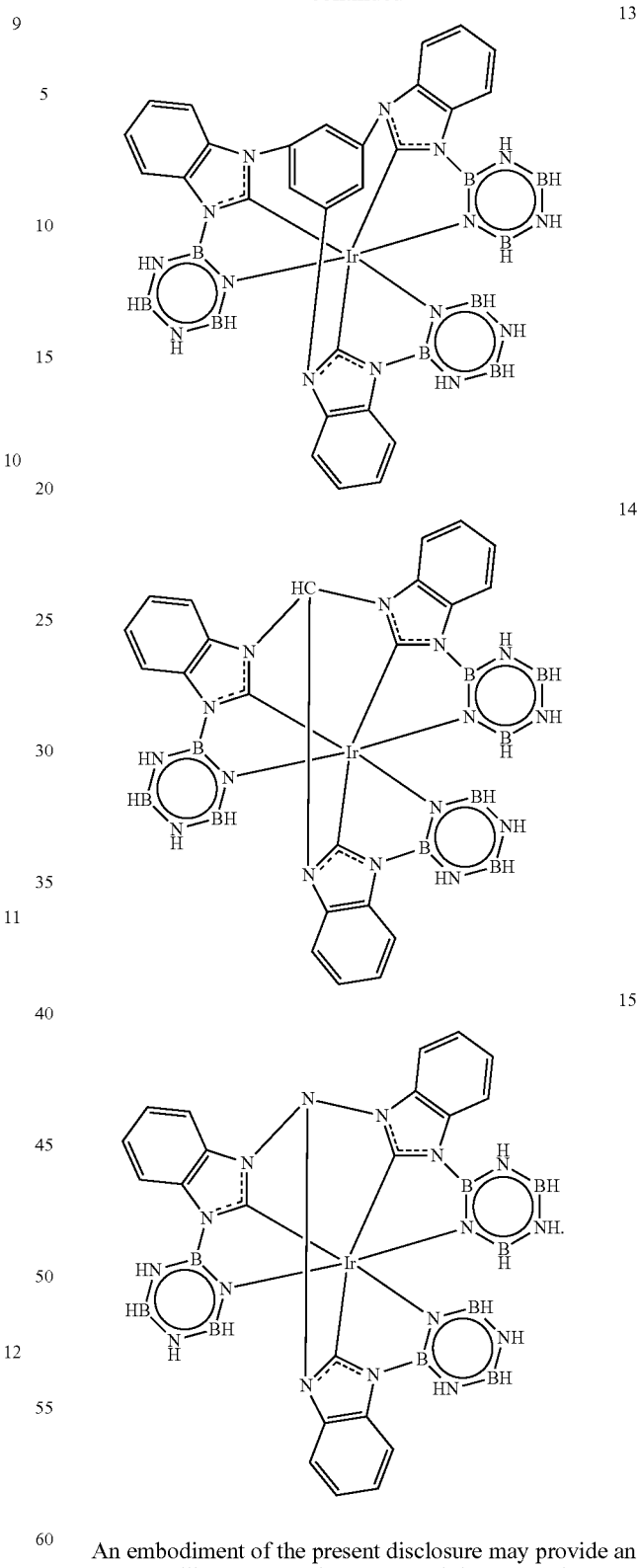
An embodiment of the present disclosure may provide an organometallic compound represented by Formula 1 or Formula 2 described above.
BRIEF DESCRIPTION OF THE DRAWINGS
The accompanying drawings are included to provide a further understanding of the present disclosure, and are incorporated in and constitute a part of this specification. The drawings illustrate example embodiments of the present disclosure and, together with the description, serve to explain principles of the present disclosure. In the drawings.

DETAILED DESCRIPTION

Figure 1:
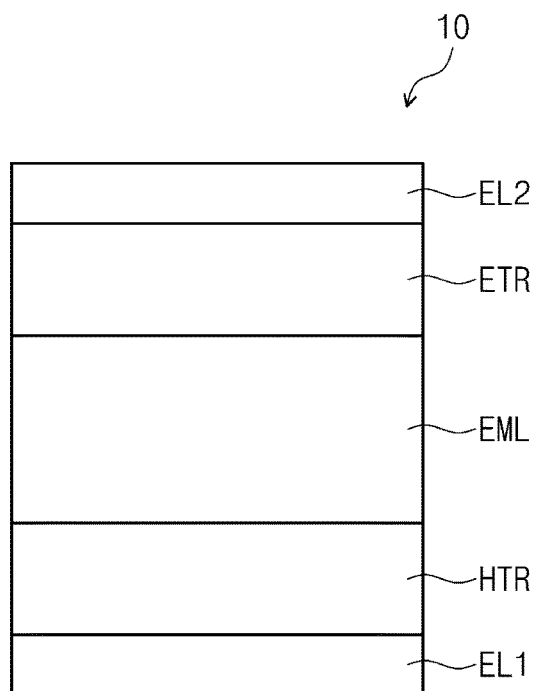
FIG. 1 is a cross-sectional view schematically illustrating an organic electroluminescence device according to an embodiment of the present disclosure.

The present disclosure may be modified in many alternative forms, and thus specific embodiments will be exemplified in the drawings and are described in more detail. It should be understood, however, that it is not intended to limit the present disclosure to the particular forms disclosed, but rather, is intended to cover all the modifications, equivalents, and alternatives falling within the spirit and technical scope of the present disclosure.

When explaining each of the drawings, like reference numerals are used for referring to similar elements. In the accompanying drawings, the dimensions of each structure are exaggeratingly illustrated for clarity of the present disclosure. Although the terms such as "first" and "second" are used herein to describe various components, these components should not be limited by these terms. The terms are only used to distinguish one component from other components. For example, a first component may be referred to as a second component, and similarly, a second component may be referred to as a first component, without departing from the scope of the present disclosure. The expression of a singular form may include plural forms unless definitely indicating a particular case in terms of the context.

In the present application, it will be understood that the meaning of "comprise," "include," and/or "have" specifies the presence of a feature, a fixed number, a step, a process, an element, a component, or a combination thereof disclosed in the specification, but does not exclude the possibility of presence or addition of one or more other features, fixed numbers, steps, processes, elements, components, or combinations thereof.

In the present application, when a layer, a film, a region, or a plate is referred to as being "on," "above," or "in an upper portion of" another layer, film, region, or plate, it may be directly on the layer, film, region, or plate (without any intervening elements therebetween), or intervening layers, films, regions, or plates may also be present. Similarly, when a layer, a film, a region, or a plate is referred to as being "under", or "in a lower portion of" another layer, film, region, or plate, it may be directly under the layer, film, region, or plate, or intervening layers, films, regions, or plates may also be present. In addition, it will be understood that when a layer, a film, a region, or a plate is referred to as being "on" another layer, film, region, or plate, it may be not only on the layer, film, region, or plate, but also under the layer, film, region, or plate.

In the description, the term "substituted or unsubstituted" may refer to a group that is unsubstituted or that is substituted with at least one substituent selected from the group consisting of a deuterium atom, a halogen atom, a cyano group, a nitro group, an amino group, a silyl group, an oxy group, a thio group, a sulfinyl group, a sulfonyl group, a carbonyl group, a boron group, a phosphine oxide group, a phosphine sulfide group, an alkyl group, an alkenyl group, an alkoxy group, a hydrocarbon ring group, an aryl group, and a heterocyclic group. In addition, each of the substituents above may itself be substituted or unsubstituted. For example, a biphenyl group may be interpreted as an aryl group or a phenyl group substituted with a phenyl group.

In the description, the expression "being bonded to an adjacent group to form a ring" may mean being bonded to an adjacent group to form a substituted or unsubstituted hydrocarbon ring, or a substituted or unsubstituted heterocyclic ring. The hydrocarbon ring includes an aliphatic hydrocarbon ring and an aromatic hydrocarbon ring. The heterocyclic ring includes an aliphatic heterocyclic ring and an aromatic heterocyclic ring. The hydrocarbon ring and the heterocyclic ring may each independently be monocyclic or polycyclic. In addition, a ring formed by being bonded to an adjacent group may be linked to another ring to form a Spiro structure.

In the description, the term "adjacent group" may refer to a pair of substituent groups where the first substituent is connected to an atom which is directly connected to another atom substituted with the second substituent; a pair of substituent groups connected to the same atom; or a pair of substituent groups where the first substituent is sterically positioned at the nearest position to the second substituent. For example, two methyl groups in 1,2-dimethylbenzene may be interpreted as "adjacent groups" to each other, and two ethyl groups in 1,1-diethylcyclopentane may be interpreted as "adjacent groups" to each other.

In the description, examples of the halogen atom may include a fluorine atom, a chlorine atom, a bromine atom, and an iodine atom.

In the description, the alkyl group may be a linear, branched or cyclic alkyl group. The number of carbons in the alkyl group is 1 to 50, 1 to 30, 1 to 20, 1 to 10, or 1 to 6. Examples of the alkyl group may include, but are not limited to, methyl group, ethyl group, n-propyl group, isopropyl group, n-butyl group, s-butyl group, t-butyl group, i-butyl group, 2-ethylbutyl group, 3,3-dimethylbutyl group, n-pentyl group, i-pentyl group, neopentyl group, t-pentyl group, cyclopentyl group, 1-methylpentyl group, 3-methylpentyl group, 2-ethylpentyl group, 4-methyl-2-pentyl group, n-hexyl group, 1-methylhexyl group, 2-ethylhexyl group, 2-butylhexyl group, cyclohexyl group, 4-methylcyclohexyl group, 4-t-butylcyclohexyl group, n-heptyl group, 1-methylheptyl group, 2,2-dimethylheptyl group, 2-ethylheptyl group, 2-butylheptyl group, n-octyl group, t-octyl group, 2-ethyloctyl group, 2-butyloctyl group, 2-hexyloctyl group, 3,7-dimethyloctyl group, cyclooctyl group, n-nonyl group, n-decyl group, adamantyl group, 2-ethyldecyl group, 2-butyldecyl group, 2-hexyldecyl group, 2-octyldecyl group, n-undecyl group, n-dodecyl group, 2-ethyldodecyl group, 2-butyldodecyl group, 2-hexyldodecyl group, 2-octyldodecyl group, n-tridecyl group, n-tetradecyl group, n-pentadecyl group, n-hexadecyl group, 2-ethylhexadecyl group, 2-butylhexadecyl group, 2-hexylhexadecyl group, 2-octylhexadecyl group, n-heptadecyl group, n-octadecyl group, n-nonadecyl group, n-eicosyl group, 2-ethyleicosyl group, 2-butyleicosyl group, 2-hexyleicosyl group, 2-octyleicosyl group, n-henicosyl group, n-docosyl group, n-tricosyl group, n-tetracosyl group, n-pentacosyl group, n-hexacosyl group, n-heptacosyl group, n-octacosyl group, n-nonacosyl group, n-triacontyl group, etc.

In the description, the hydrocarbon ring group refers to any functional group or substituent derived from an aliphatic hydrocarbon ring. The hydrocarbon ring group may be a saturated hydrocarbon ring group having a carbon number for forming a ring of 5 to 20.

In the description, the aryl group refers to a functional group or substituent derived from an aromatic hydrocarbon ring. The aryl group may be a monocyclic aryl group or a polycyclic aryl group. The carbon number for forming a ring in the aryl group may be 6 to 30, 6 to 20, or 6 to 15. Examples of the aryl group may include, but are not limited to, a phenyl group, a naphthyl group, a fluorenyl group, an anthracenyl group, a phenanthryl group, a biphenyl group, a terphenyl group, a quaterphenyl group, a quinquephenyl group, a sexaphenyl group, a triphenylenyl group, a pyrenyl group, a benzofluoranthenyl group, a chrysenyl group, etc.

In the description, the heterocyclic group may include one or more selected from B, O, N, P, Si, and S as a heteroatom. In the case where the heterocyclic group includes two or more heteroatoms, two or more heteroatoms may be the same as or different from each other. The heterocyclic group may be a monocyclic heterocyclic group or a polycyclic heterocyclic group, and include a heteroaryl group. The number of carbons for forming a ring of the heterocyclic group may be 2 to 30, 2 to 20, or 2 to 10.

In the description, the aliphatic heterocyclic group may include one or more selected from B, O, N, P, Si, and S as a heteroatom. The number of carbons for forming a ring of the aliphatic heterocyclic group may be 2 to 30, 2 to 20, or 2 to 10. Examples of the aliphatic heterocyclic group may include, but are not limited to, oxirane group, thiirane group, pyrrolidine group, piperidine group, tetrahydrofuran group, tetrahydrothiophene group, thiane group, tetrahydropyran group, 1,4-dioxane group, etc.

In the description, the number of carbons for forming a ring of the heteroaryl group may be 2 to 30, 2 to 20, or 2 to 10. Examples of the heteroaryl group may include, but are not limited to, thiophene, furan, pyrrole, imidazole, thiazole, oxazole, oxadiazole, triazole, pyridine, bipyridine, pyrimidine, triazine, triazole, acridine, pyridazine, pyrazine, quinoline, quinazoline, quinoxaline, phenoxazine, phthalazine, pyrido pyrimidine, pyrido pyrazine, pyrazino pyrazine, isoquinoline, indole, carbazole, N-arylcarbazole, N-heteroarylcarbazole, N-alkylcarbazole, benzoxazole, benzoimidazole, benzothiazole, benzocarbazole, benzothiophene, dibenzothiophene, thienothiophene, benzofuran, phenanthroline, thiazole, isooxazole, oxadiazole, thiadiazole, phenothiazine, dibenzosilole, dibenzofuranyl, etc.

In the description, the above description with respect to the aryl group may be applied to an arylene group except that the arylene group is a divalent group. The above description with respect to the heteroaryl group may be applied to a heteroarylene group except that the heteroarylene group is a divalent group.

In the description, the above description with respect to the alkyl group may be applied to a trivalent alkyl group except that the trivalent alkyl group is a trivalent group. The above description with respect to the aryl group may be applied to a trivalent aryl group except that the trivalent aryl group is a trivalent group. The above description with respect to the heteroaryl group may be applied to a trivalent heteroaryl group except that the heteroaryl group is a trivalent group.

In the description, the alkenyl group may be a linear or branched chain alkenyl group. The number of carbons of the alkenyl group may be 2 to 30, 2 to 20 or 2 to 10, but is not limited thereto. Examples of the alkenyl group include, but are not limited to, a vinyl group, 1-butenyl group, 1-pentenyl group, 1,3-butadienyl aryl group, styrenyl group, styryl vinyl group, etc.

In the description, the carbon number of the amine group may be 1 to 30, but is not particularly limited thereto. The amine group may include an alkyl amine group and an aryl amine group. Examples of the amine group may include, but are not limited to, methylamine group, dimethylamine group, phenylamine group, diphenylamine group, naphthylamine group, 9-methyl-anthracenylamine group, triphenylamine group, etc.

In the description, the direct linkage may mean a single bond.

In the description, "atoms for forming a ring" may refer to ring-forming atoms.

FIGS. 1 to 4 are a cross-sectional view schematically illustrating an organic electroluminescence device according to an embodiment of the present disclosure. Referring to FIGS. 1 to 4, in an organic electroluminescence device 10 according to an embodiment of the present disclosure, a first electrode EL1 and a second electrode EL2 are positioned facing each other, and an emission layer EML may be provided between the first electrode EL1 and the second electrode EL2.

Furthermore, the organic electroluminescence device 10 of an embodiment may further include a plurality of functional layers between the first electrode EL1 and the second electrode EL2, in addition to the emission layer EML. The plurality of functional layers may include a hole transport region HTR, and an electron transport region ETR. For example, the organic electroluminescence device 10 according to an embodiment of the present disclosure may include a first electrode EL1, a hole transport region HTR, an emission layer EML, an electron transport region ETR, and a second electrode EL2 which are laminated sequentially. In some embodiments, the organic electroluminescence device 10 of an embodiment may include a capping layer CPL on the second electrode EL2.

The organic electroluminescence device 10 of an embodiment may include an organometallic compound according to an embodiment described below in more detail in the emission layer EML between the first electrode EL1 and the second electrode EL2. However, embodiments are not limited thereto, and the organic electroluminescence device 10 may include the organometallic compound in the hole transport region HTR or the electron transport region ETR, which are among the plurality of functional layers between the first electrode EU and the second electrode EL2, or may include the organometallic compound in the capping layer CPL on the second electrode EL2, as well as in the emission layer EML.

Figure 2:
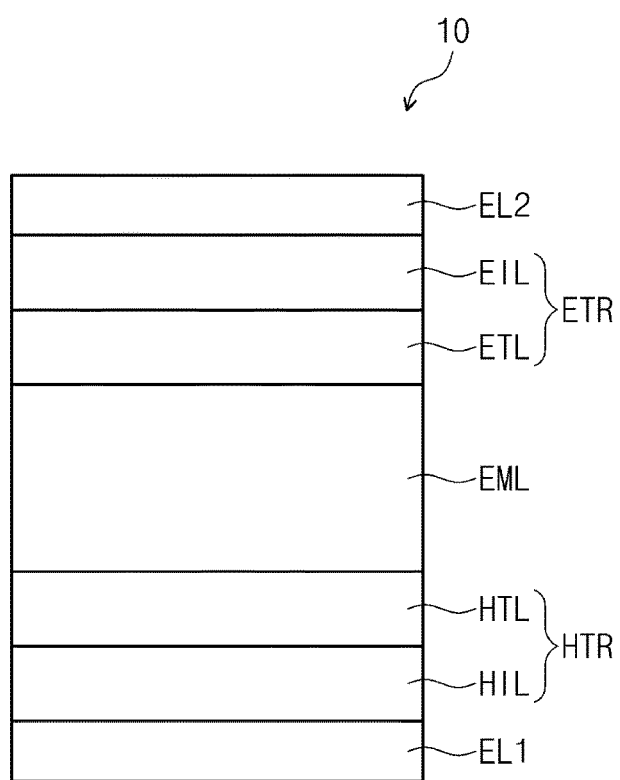
FIG. 2 is a cross-sectional view schematically illustrating an organic electroluminescence device according to an embodiment of the present disclosure.
Figure 3:
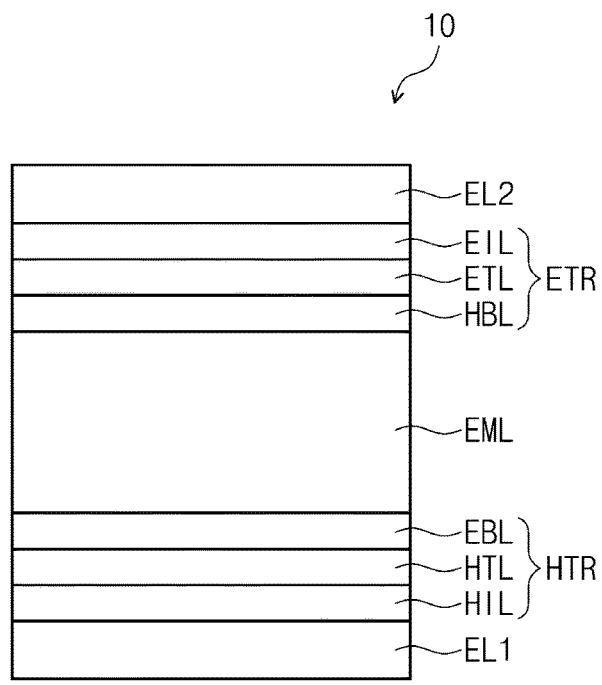
FIG. 3 is a cross-sectional view schematically illustrating an organic electroluminescence device according to an embodiment of the present disclosure.
Figure 4:
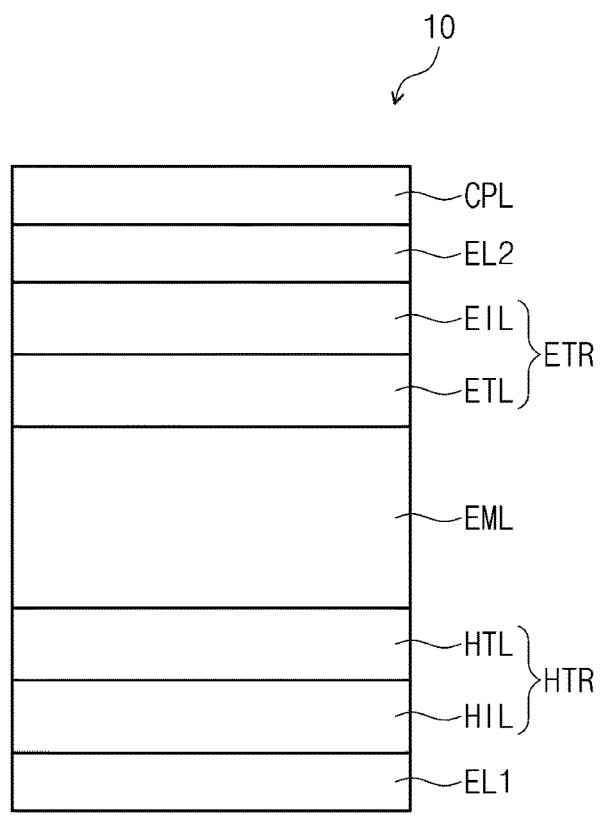
FIG. 4 is a cross-sectional view schematically illustrating an organic electroluminescence device according to an embodiment of the present disclosure.

Meanwhile, when compared with FIG. 1, FIG. 2 shows a cross-sectional view of an organic electroluminescence device 10 of an embodiment, wherein the hole transport region HTR includes a hole injection layer HIL and a hole transport layer HTL, and the electron transport region ETR includes an electron injection layer EIL and an electron transport layer ETL. Furthermore, when compared with FIG. 1, FIG. 3 shows a cross-sectional view of an organic electroluminescence device 10 of an embodiment, wherein the hole transport region HTR includes a hole injection layer HIL, a hole transport layer HTL, and an electron blocking layer EBL, the electron transport region ETR includes an electron injection layer EIL, an electron transport layer ETL, and a hole blocking layer HBL. When compared with FIG. 2, FIG. 4 shows a cross-sectional view of an organic electroluminescence device 10 of an embodiment including the capping layer CPL on the second electrode EL2.

The first electrode EL1 has conductivity. The first electrode EL1 may be formed of a metal alloy or any suitable conductive compound. The first electrode EL1 may be an anode. In some embodiments, the first electrode EL1 may be a pixel electrode. The first electrode EL1 may be a transmissive electrode, a transflective electrode, or a reflective electrode. When the first electrode EL1 is the transmissive electrode, the first electrode EL1 may include a transparent metal oxide, for example, indium tin oxide (ITO), indium zinc oxide (IZO), zinc oxide (ZnO), and/or indium tin zinc oxide (ITZO). When the first electrode EL1 is the transflective electrode or the reflective electrode, the first electrode EL1 may include Ag, Mg Cu, Al, Pt, Pd, Au, Ni, Nd, Ir, Cr, Li, Ca, LiF/Ca, LiF/Al, Mo, Ti, or a compound or mixture thereof (e.g., a mixture of Ag and Mg). In some embodiments, the first electrode EL1 may have a multi-layered structure including a reflective layer or transflective layer and a transparent conductive layer formed of indium tin oxide (ITO), indium zinc oxide (IZO), zinc oxide (ZnO), and/or indium tin zinc oxide (ITZO). For example, the first electrode EL1 may have, but is not limited to, a three-layer structure of ITO/Ag/ITO. The first electrode EL1 may have a thickness from about 1,000 Å to about 10,000 Å, for example, from about 1,000 Å to about 3,000 Å.

The hole transport region HTR is provided on the first electrode EL1. The hole transport region HTR may include at least one selected from a hole injection layer HIL, a hole transport layer HTL, a hole buffer layer, and an electron blocking layer.

The hole transport region HTR may have a multilayer structure having a single layer formed of a single material, a single layer formed of materials different from each other, or a plurality of layers formed of materials different from each other.

For example, the hole transport region HTR may have a single layer structure of a hole injection layer HIL or a hole transport layer HTL, or a single layer structure formed of a hole injection material or a hole transport material. In some embodiments, the hole transport region HTR has a single layer structure formed of materials different from each other, or a structure of hole injection layer HIL/hole transport layer HTL, hole injection layer HIL/hole transport layer HTL/hole buffer layer, hole injection layer HIL/hole buffer layer, hole transport layer HTL/hole buffer layer, or hole injection layer HIL/hole transport layer HTL/electron blocking layer, which are sequentially laminated from the first electrode EL1, but embodiments are not limited thereto.

The hole transport region HTR may be formed by using one or more suitable methods, such as a vacuum deposition method, a spin coating method, a casting method, a Langmuir-Blodgett (LB) method, an inject printing method, a laser printing method, and/or a laser induced thermal imaging (LITI) method.

The hole injection layer HIL may include, for example, a phthalocyanine compound (such as copper phthalocyanine); N,N'-diphenyl-N,N'-bis-[4-(phenyl-m-tolyl-amino)-phenyl]-biphenyl-4,4'-diamine (DNTPD), 4,4',4"-tris(3-methylphenylphenylamino)triphenylamine (m-MTDATA), 4,4', 4"-tris(N,N-diphenylamino)triphenylamine (TDATA), 4,4', 4"-tris{N,-(2-naphthyl)-N-phenylamino)-triphenylamine (2-TNATA), poly(3,4-ethylenedioxythiophene)/poly(4-styrenesulfonate) (PEDOT/PSS), polyaniline/dodecylbenzenesulfonic acid (PANI/DBSA), polyaniline/camphor sulfonic acid (PANI/CSA), polyaniline/poly(4-styrenesulfonate) (PANI/PSS), N,N'-di(naphthalene-1-yl)-N,N'-diphenyl-benzidine (NPB), triphenylamine-containing polyetherketone (TPAPEK), 4-isopropyl-4'-methyldiphenyliodonium tetrakis(pentafluorophenyl)borate, dipyrazino[2,3-f: 2',3'-h]quinoxaline-2,3,6,7,10,11-hexacarbonitrile (HAT-CN), etc.

The hole transport layer HTL may further include, for example, carbazole derivatives (such as N-phenyl carbazole and/or polyvinyl carbazole), fluorine derivatives, N,N'-bis (3-methylphenyl)-N,N'-diphenyl-[1,1-biphenyl]-4,4'-diamine (TPD), triphenylamine derivatives (such as 4,4',4"-tris(N-carbazolyl)triphenylamine (TCTA)), N,N'-di (naphthalene-1-yl)-N,N'-diphenyl-benzidine (NPB), 4,4'-cyclohexylidene bis[N,N-bis(4-methylphenyl] benzenamine] (TAPC), 4,4'-bis[N,N'-(3-tolyl)amino]-3,3'-dimethylbiphenyl (HMTPD), 1,3-Bis(N-carbazolyl)benzene (mCP), etc.

The hole transport region HTR may have a thickness from about 100 Å to about 10,000 Å, for example, from about 100 Å to about 5,000 Å. The hole injection layer HIL may have a thickness, for example, from about 30 Å to about 1,000 Å, the hole transport layer HTL may have a thickness from about 30 Å to about 1,000 Å. For example, the electron blocking layer EBL may have a thickness from about 10 Å to about 1,000 Å. When the thicknesses of the hole transport region HTR, the hole injection layer HIL, the hole transport layer HTL, and the electron blocking layer EBL each independently satisfy the above-described range(s), satisfactory (or suitable) hole transport characteristics may be achieved without a substantial increase in driving voltage.

The hole transport region HTR may further include a charge generating material, in addition to the above-described materials, to improve conductivity. The charge generating material may be uniformly or non-uniformly dispersed into the hole transport region HTR. The charge generating material may be, for example, a p-dopant. The p-dopant may be one selected from quinone derivatives, metal oxides, and cyano group-containing compounds, but is not limited thereto. For example, non-limiting examples of the p-dopant may include quinone derivatives (such as tetracyanoquinodimethane (TCNQ) and/or 2,3,5,6-tetrafluoro-7,7,8,8-tetracyanoquinodimethane (F4-TCNQ)), and metal oxides (such as tungsten oxides and/or molybdenum oxides).

The hole transport region HTR may further include at least one of the hole buffer layer or the electron blocking layer EBL, in addition to the hole injection layer HIL and the hole transport layer HTL. The hole buffer layer may compensate a resonance distance according to the wavelength of light emitted from the emission layer EML to increase luminous efficiency. A material that may be included in the hole transport layer may be used as a material for the hole buffer layer. The electron blocking layer EBL is a layer playing the role of blocking or reducing the electron injection from the electron transport region ETR to the hole transport region HTR.

The emission layer EML is provided on the hole transport region HTR. The emission layer EML may have a thickness, for example, from about 100 Å to about 1,000 Å, or from about 100 Å to about 300 Å. The emission layer EML may have a multilayer structure having a single layer formed of a single material, a single layer formed of materials different from each other, or a plurality of layers formed of materials different from each other.

The emission layer EML may include the organometallic compound of an embodiment.

The organometallic compound of an embodiment may contain a metal atom and a ligand linked with the metal atom.

The ligand may include an aryl group and/or a heteroaryl group, and at least one borazine group which is directly linked to the metal atom. The aryl group may be a substituted or unsubstituted aryl group having 6 to 30 carbon atoms for forming a ring. The heteroaryl group may be a substituted or unsubstituted heteroaryl group having 1 to 30 carbon atoms for forming a ring. The borazine group may be substituted or unsubstituted. For example, the aryl group may be a substituted or unsubstituted benzene derivative. The heteroaryl group may be a substituted or unsubstituted aromatic carbene derivative. The carbene derivative may be, for example, an imidazol-2-ylidenes derivative, or a 1,2,4-triazol-3-ylidenes derivative.

The metal atom may be a platinum (Pt) atom, an iridium (Ir) atom, a palladium (Pd) atom, or an osmium (Os) atom. For example, the metal atom may be a platinum atom or an iridium atom. The oxidation number of a platinum atom may be +2 (e.g., Pt(II)), the oxidation number of an iridium atom may be +3 (e.g., Ir(III)).

The ligand may be a tridentate ligand, a tetradentate ligand, or a hexadentate ligand.

For example, the metal atom may be a platinum atom, and the ligand may be a tetradentate ligand. In some embodiments, the metal atom may be an iridium atom, and the ligand may be bis-tridentate ligands (e.g., two tridentate ligands) or one hexadentate ligand.

The difference [$\Delta(T_1-{}^3MC)$] between $T_1$ energy level and $^3MC$ energy level of the organometallic compound of an embodiment may be 0.3 eV or more.

The organometallic compound of an embodiment may be represented by Formula 1 or Formula 2:

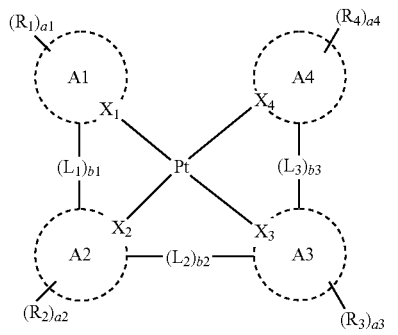

Formula 1

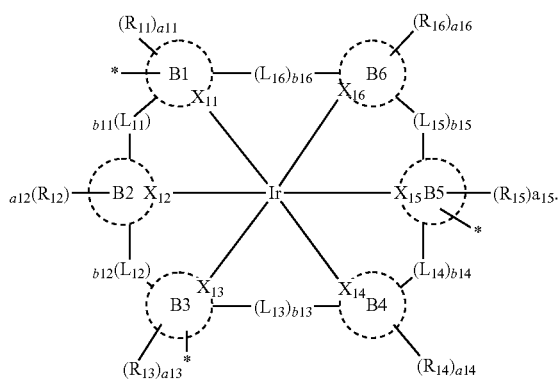

Formula 2

In Formula 1 and Formula 2, $X_1$ to $X_4$, and $X_{11}$ to $X_{16}$ may be each independently a carbon atom or a nitrogen atom.

A1 to A4 and B1 to B6 may be each independently an aryl group or a heteroaryl group. The aryl group may be a substituted or unsubstituted aryl group having 6 to 30 carbon atoms for forming a ring. The heteroaryl group may be a substituted or unsubstituted heteroaryl group having 1 to 30 carbon atoms for forming a ring.

At least one selected from A1 to A4 may be a borazine group. At least one selected from B1 to B6 may be a substituted or unsubstituted borazine group.

$R_1$ to $R_4$ and $R_{11}$ to $R_{16}$ may be each independently a hydrogen atom, a deuterium atom, an alkyl group, an aryl group, or a heteroaryl group, and any of $R_1$ to $R_4$ and $R_{11}$ to $R_{16}$ may be combined with an adjacent group to form a ring. The alkyl group may be a substituted or unsubstituted alkyl group having 1 to 20 carbon atoms. The aryl group may be a substituted or unsubstituted aryl group having 6 to 30 carbon atoms for forming a ring. The heteroaryl group may be a substituted or unsubstituted heteroaryl group having 1 to 30 carbon atoms for forming a ring. For example, $R_1$ to $R_4$ and $R_{11}$ to $R_{16}$ may be each independently a hydrogen atom, a methyl group, and any of $R_1$ to $R_4$ and $R_{11}$ to $R_{16}$ may be combined with an adjacent group to form an aryl group, or a heteroaryl group a1 to a4 may be each independently an integer of 0 to 3. a11 to a16 may be each independently an integer of 0 to 3.

When a1 is 0, this may mean that A1 is substituted with hydrogen. When a1 is an integer of 2 or more, a plurality of $R_1$'s may be the same as or different from each other. The plurality of $R_1$'s may be combined to form a ring. For example, $R_1$'s may be combined to form a benzene ring, or a nitrogen-containing aromatic heterocyclic ring. The nitrogen-containing aromatic heterocyclic ring may be a pyridine ring, or a pyrazine ring. The same descriptions as those provided for a1 may be applied with regard to a2 to a3 and a11 to a16, and thus redundant descriptions will not be provided.

$L_1$ to $L_3$ and $L_{11}$ to $L_{16}$ may be each independently a direct linkage, *—O—*, *—S—*, a divalent alkyl group, an arylene group, or a heteroarylene group. The divalent alkyl group may be a substituted or unsubstituted divalent alkyl group having 1 to 20 carbon atoms. The arylene group may be a substituted or unsubstituted arylene group having 6 to 30 carbon atoms for forming a ring. The heteroarylene group may be a substituted or unsubstituted heteroarylene group having 1 to 30 carbon atoms for forming a ring. For example, each of $L_1$ to $L_3$ and $L_1$ to $L_{16}$ may be a direct linkage. In some embodiments, $L_1$ and $L_3$ may be a direct linkage, and $L_2$ may be *—O—*.

b1 to b4 may be each independently 0 or 1. b11 to b16 may be each independently 0 or 1. For example, each of b1 to b4 may be 1. In b11 to b16, b13 and b16 may be 0, and the rest may be 1. In b11 to b16, b11, b13, and b16 may be 1, and the rest may be 0.

In Formula 2, B1, B3, and B5 may be optionally linked to a linker represented by Formula 2A. For example, B1, B3, and B5 may be linked or not linked to a linker represented by Formula 2A:

Formula 2A

In Formula 2 and Formula 2A, —* means a site in which B1, B3, B5, and $L_{31}$ are bonded to each other.

In Formula 2A above, $L_{31}$ may be a nitrogen atom, a trivalent alkyl group, a trivalent aryl group, or a trivalent heteroaryl group. For example, the trivalent alkyl group may be a substituted or unsubstituted trivalent alkyl group having 1 to 20 carbon atoms. The trivalent aryl group may be a substituted or unsubstituted trivalent aryl group having 6 to 30 carbon atoms for forming a ring. The trivalent heteroaryl group may be a substituted or unsubstituted trivalent heteroaryl group having 1 to 30 carbon atoms for forming a ring.

c may be 0 or 1. When c is 1, B1, B3, and B5 are linked with a linker represented by Formula 2A. When c is 0, B1, B3, and B5 are not linked with a linker represented by Formula 2A. When c is 0, —* may be the same as those defined in Ru to $R_{16}$.

$L_{31}$ may be represented by Formula 2A-1, Formula 2A-2, or Formula 2A-3.

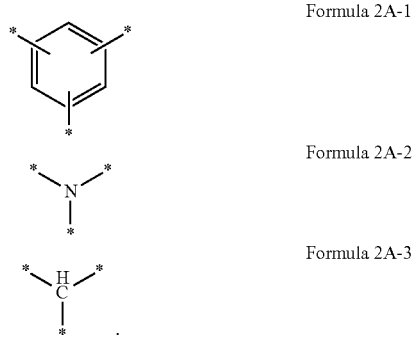

Formula 2A-1

Formula 2A-2

Formula 2A-3

Meanwhile, A1 to A4 and B1 to B6 may be each independently any one selected from LG1 to LG3.

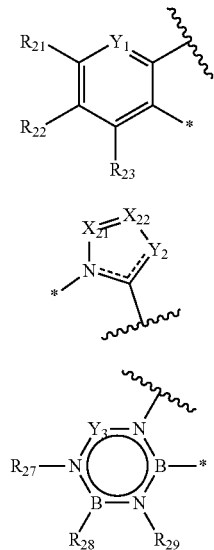

LG1

LG2

LG3

In LG1 to LG3, $X_{21}$ and $X_{22}$ may be each independently $CR_{24}$, or a nitrogen atom (e.g., $NR_{24}$). For example, both of $X_{21}$ and $X_{22}$ may be $NR_{24}$. In some embodiments, any one selected from $X_{21}$ and $X_{22}$ may be $CR_{24}$, and the other may be a nitrogen atom.

$Y_1$ may be $CR_{25}$ or C—*, $Y_2$ may be $NR_{26}$ or N—, and $Y_3$ may be B or B—*.

$R_{21}$ to $R_{29}$ may be each independently a hydrogen atom, a deuterium atom, an alkyl group, an aryl group, or a heteroaryl group, or may be combined with an adjacent group to form a ring. The alkyl group may be a substituted or unsubstituted alkyl group having 1 to 20 carbon atoms. The aryl group may be a substituted or unsubstituted aryl group having 6 to 30 carbon atoms for forming a ring. The heteroaryl group may be a substituted or unsubstituted heteroaryl group having 1 to 30 carbon atoms for forming a ring. For example, $R_{21}$ to $R_{23}$ may be a hydrogen atom, and $R_{27}$ to $R_{29}$ may be a hydrogen atom. When both of $X_{21}$ and $X_{22}$ are $CR_{24}$, $R_{24}$'s may be combined to form a ring.

In LG1 to LG3,

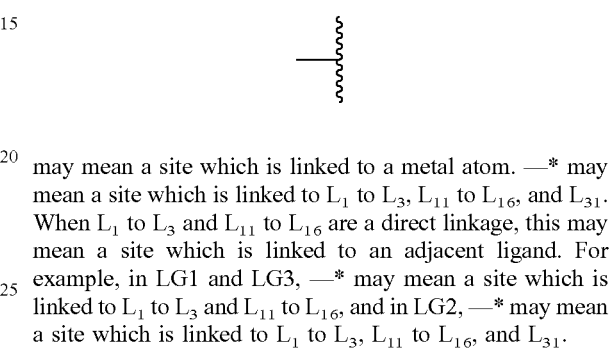

may mean a site which is linked to a metal atom. —* may mean a site which is linked to $L_1$ to $L_3$, $L_{11}$ to $L_{16}$, and $L_{31}$. When $L_1$ to $L_3$ and $L_{11}$ to $L_{16}$ are a direct linkage, this may mean a site which is linked to an adjacent ligand. For example, in LG1 and LG3, —* may mean a site which is linked to $L_1$ to $L_3$ and $L_{11}$ to $L_{16}$, and in LG2, —* may mean a site which is linked to $L_1$ to $L_3$, $L_{11}$ to $L_{16}$, and $L_{31}$.

LG2 may be represented by LG2-1 to LG2-3.

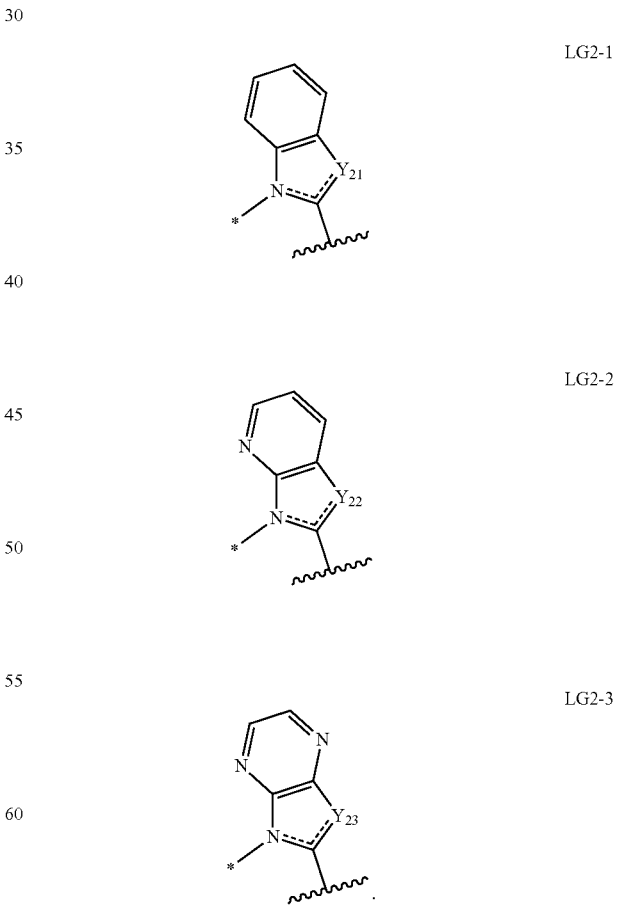

LG2-1

LG2-2

LG2-3

In LG2-1 to LG2-3, $Y_{21}$ to $Y_{23}$ may be each independently $NR_{26}$ or N—. $R_{26}$ may be the same as defined in LG2.

Formula 1 may be represented by Formula 1-A:

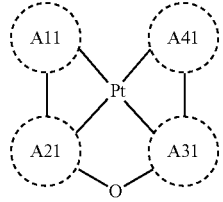

Formula 1-A

In Formula 1-A, each of A11 to A41 may be defined the same as the descriptions provided in A1 to A4.

For example, A11 to A41 may be each independently any one selected from LG1 to LG3, and at least one selected from A11 to A41 may be LG3.

For example, A11 and A41 may be LG2. A21 and A31 may be each independently LG1 or LG3. At least one selected from A21 and A31 may be LG3. For example, both of A21 and A31 may be LG3.

Formula 1-A may be represented by Formula 1-1:

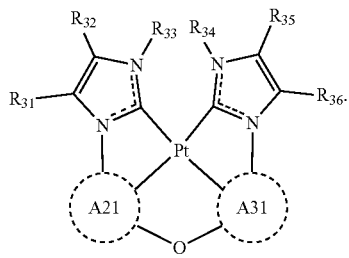

Formula 1-1

In Formula 1-1, A21 and A31 may be the same as those defined in Formula 1-A. $R_{31}$ to $R_{36}$ may be defined the same as $R_{24}$ described above.

Formula 2 may be represented by Formula 2-A:

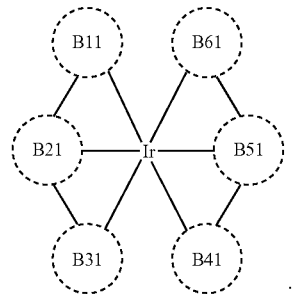

Formula 2-A

Formula 2-A is a formula in which B1 to B6, $L_{11}$ to $L_{16}$, and b11 to b16 are specified in Formula 2. Formula 2-A is a formula in which c is specified to 0 in Formula 2A.

In Formula 2-A, B11 to B61 may be each independently any one selected from LG1 to LG3, and at least one selected from B11 to B61 may be LG3.

For example, B11 and B31 may be LG2, and B21 may be LG1. B41 to B61 may be each independently LG1, LG2, or LG3, and at least one selected from B41 to B61 may be LG3. For example, B41 and B61 may be LG3, and B51 may be LG3.

Formula 2-A may be represented by Formula 2-1:

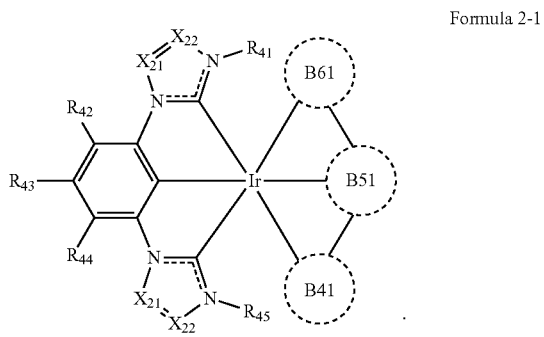

Formula 2-1

In Formula 2-1, B41 to B6 may be the same as those defined in Formula 2-A. $R_{41}$ to $R_{45}$ may be defined the same as $R_{21}$ to $R_{24}$ described above. $X_{21}$ and $X_{22}$ may be the same as those defined in LG2.

Formula 2 may be represented by Formula 2-B:

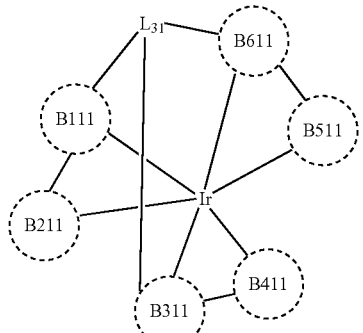

Formula 2-B

Formula 2-B is a formula in which B1 to B6, $L_{11}$ to $L_{16}$, and b11 to b16 are specified in Formula 2. Formula 2-B is a formula in which c is specified to 1 in Formula 2A.

In Formula 2-B, B111 to B611 may be each independently any one selected from LG1 to LG3, and at least one selected from B111 to B611 may be LG3. $L_{31}$ may be the same as defined in Formula 2A.

For example, B111, B311 and B611 may be LG2, and B211, B422, and B511 may be LG3.

Formula 2-B may be represented by Formula 2-2:
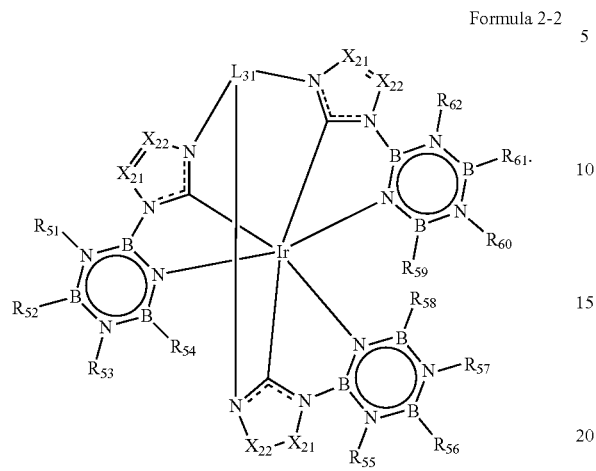
Formula 2-2
$R_{51}$ to $R_{62}$ may be defined the same as $R_{24}$ to $R_{27}$ described above.
$L_{31}$ may be the same as defined in Formula 2A. $X_{21}$ and $X_{22}$ may be the same as defined in LG2.
Formula 1 may be any one selected from the compounds represented by Compound Group 1 below:
Compound Group 1
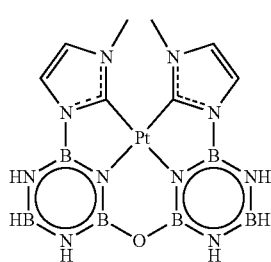
1
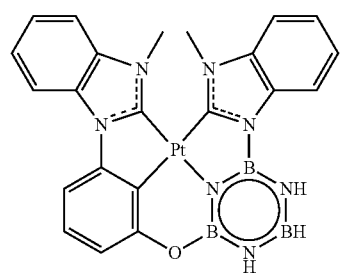
2
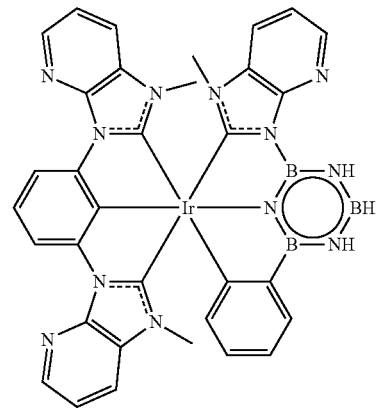 
3
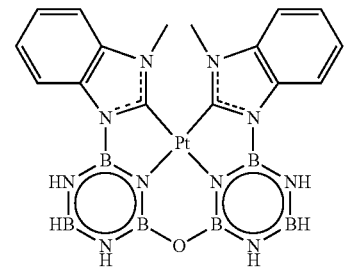
4
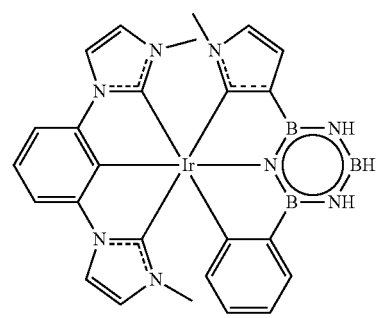
5
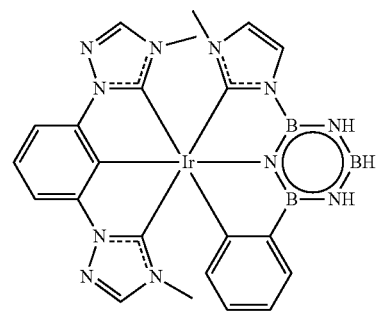
6
7

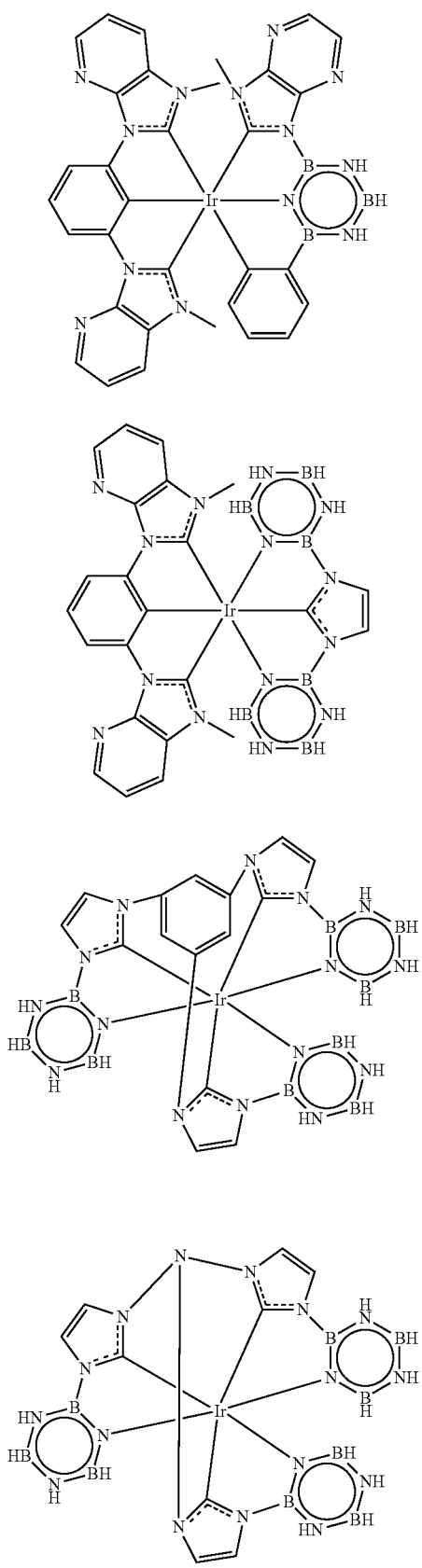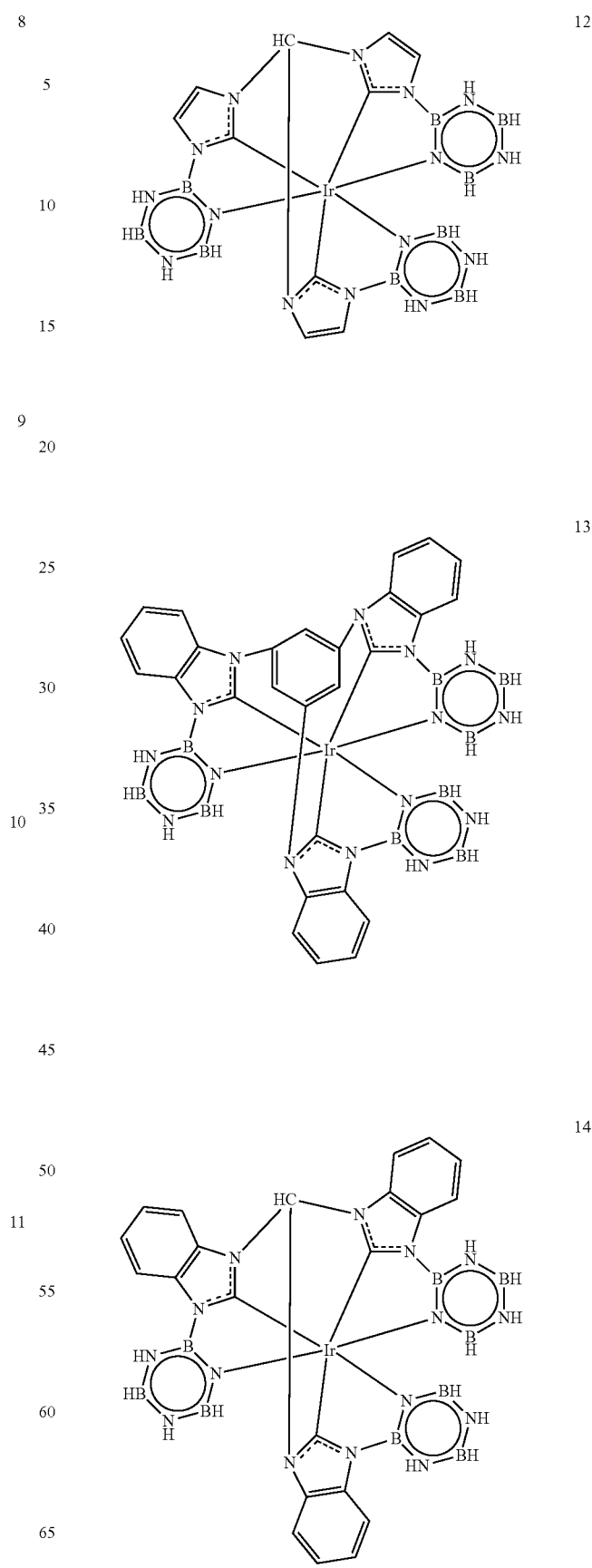

-continued

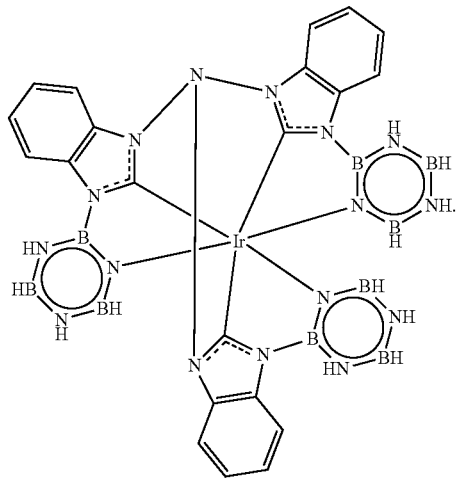

In the description, Ph may mean a phenyl group.

The organometallic compound is unlikely to emit light having a short wavelength without the introduction of an electron withdrawing group (EWG). For example, when the electron withdrawing group is not introduced to the organometallic compound including an iridium complex, the organometallic compound may emit light having a center wavelength in a green region or a sky-blue region, and is unlikely to emit deep-blue light. When the electron withdrawing group (a halogen atom, a cyano group, etc.) is introduced to the organometallic compound in order to make the luminous wavelength shorter, electrons in the organometallic compound are localized, and thus service life of the organometallic compound is deteriorated.

Meanwhile, when the organometallic compound has a shallow highest occupied molecular orbital (HOMO) energy, service life of the organometallic compound is deteriorated by triplet-polaron quenching (TPQ).

Furthermore, when the difference value between an energy level of $^3$MC state (triplet metal centered state) of the organometallic compound (in the organometallic compound, an energy level of $^3$MLCT and a $T_1$ energy level have a substantially identical value, and thus the term "$^3$MLCT and $T_1$" may be used interchangeably in the description) and an energy level of $^3$MLCT state (triplet metal-to-ligand charge transfer state) is small, the linkage between the ligand and the metal atom of the organometallic compound may be broken, and thus a luminous material may be easily deteriorated.

However, the organometallic compound of an embodiment has a ligand including at least one borazine group, which is directly linked to the metal atom. Therefore, the organometallic compound of an embodiment may have a deep T1 energy level (a lowest triplet energy level) without the introduction of the electron withdrawing group, thereby emitting deep-blue light having a short wavelength. Furthermore, because the organometallic compound of an embodiment has a deep HOMO energy level, service life deteriorated by TPQ may be improved to achieve long service life.

Moreover, because the difference [$\Delta$(T1–$^3$MC)] between T1 energy level and $^3$MC energy level is 0.3 eV or more, or 0.6 eV or more, the linkage between the ligand and the metal atom of the organometallic compound is not easily broken, and thus service life of the device may be improved.

In the organic electroluminescence device 10 of an embodiment illustrated in FIGS. 1 to 3, the emission layer EML may include a host and a dopant, and the dopant may include the organometallic compound of an embodiment.

The emission layer EML including the organometallic compound of an embodiment may emit blue light having a center wavelength at a region adjacent to deep-blue or near-ultraviolet. For example, the emission layer EML may emit light having a center wavelength of 420 nm to 470 nm. The emission layer EML may emit light having a center wavelength of 420 nm to 470 nm through a phosphorescence luminescence.

In the organic electroluminescence device 10 of an embodiment, the emission layer EML may further include anthracene derivatives, pyrene derivatives, fluoranthene derivatives, chrysene derivatives, dehydrobenzanthracene derivatives, and/or triphenylene derivatives. For example, the emission layer EML may include anthracene derivatives and/or pyrene derivatives.

The emission layer EML may include any suitable host material. For example, the emission layer EML may include, as host material(s), at least one selected from bis[2-(diphenylphosphino)phenyl] ether oxide (DPEPO), 4,4'-Bis(carbazol-9-yl)biphenyl (CBP), 1,3-bis(carbazol-9-yl)benzene (mCP), 2,8-Bis(diphenylphosphoryl)dibenzo[b,d]furan (PPF), tris(4-carbazoyl-9-ylphenyl)amine (TCTA), and 1,3,5-tris(1-phenyl-1H-benzo[d]imidazol-2-yl)benzene (TPBi). However, embodiments are not limited thereto, for example, tris(8-hydroxyquinolino)aluminum (Alq$_3$), 4,4'-bis(N-carbazolyl)-1,1'-biphenyl (CBP), poly(n-vinylcabazole (PVK), 9,10-di(naphthalene-2-yl)anthracene (ADN), tris(carbazol-9-yl)-triphenylamine (TCTA), 1,3,5-tris(1-phenyl-1H-benzo[d]imidazol-2-yl)benzene (TPBi), 3-tert-butyl-9,10-di(naphth-2-yl)anthracene (TBADN), distyrylarylene (DSA), 4,4'-bis(9-carbazolyl)-2,2'-dimethyl-biphenyl (CDBP), 2-methyl-9,10-bis(naphthalen-2-yl)anthracene (MADN), bis[2-(diphenylphosphino)phenyl]ether oxide (DPEPO), hexaphenylcyclotriphosphazene (CP1), 1,4-bis(triphenylsilyl)benzene (UGH2), hexaphenylcyclotrisiloxane (DPSiO$_3$), octaphenylcyclotetra siloxane (DPSiO$_4$), 2,8-bis(diphenylphosphoryl)dibenzofuran (PPF), etc. may be used as host materials.

In an embodiment, the emission layer EML may include, as dopant material(s), styryl derivatives (e.g., 1,4-bis[2-(3-N-ethylcarbazoryl)vinyl]benzene (BCzVB), 4-(di-p-tolylamino)-4'-[(di-p-tolylamino)styryl]stilbene (DPAVB), and/or N-(4-((E)-2-(6-((E)-4-(diphenylamino)styryl)naphthalen-2-yl)vinyl)phenyl)-N-phenylbenzenamine (N-BDAVBi)), perylene and/or the derivatives thereof (e.g., 2,5,8,11-tetra-t-butylperylene (TBP)), pyrene and/or the derivatives thereof (e.g., 1-dipyrene, 1,4-dipyrenylbenzene, and/or 1,4-bis(N,N-diphenylamino)pyrene), etc.

In the organic electroluminescence device 10 of an embodiment shown in FIGS. 1 to 3, the electron transport region ETR is on the emission layer EML. The electron transport region ETR may include, but is not limited to, at least one of the hole blocking layer HBL, the electron transport layer ETL, or the electron injection layer EIL.

The electron transport region ETR may have a multilayer structure having a single layer formed of a single material, a single layer formed of materials different from each other, or a plurality of layers formed of materials different from each other.

For example, the electron transport region ETR may have a single layer structure of an electron injection layer EIL or an electron transport layer ETL, or a single layer structure formed of electron injection material(s) and/or electron transport material(s). In some embodiments, the electron transport region ETR may have a single layer structure formed of materials different from each other, or a structure of electron transport layer ETL/electron injection layer EIL, hole blocking layer HBL/electron transport layer ETL/electron injection layer (EIL) which are sequentially laminated from the emission layer EML, but embodiments are not limited thereto. The electron transport region ETR may have a thickness, for example, from about 1,000 Å to about 1,500 Å.

The electron transport area ETA may be formed by using one or more suitable methods such as a vacuum deposition method, a spin coating method, a casting method, a Langmuir-Blodgett (LB) method, an inkjet printing method, a laser printing method, and/or a laser induced thermal imaging (LITI) method.

If the electron transport region ETR includes the electron transport layer ETL, the electron transport region ETR may include an anthracene-based compound. However, embodiments are not limited thereto, and the electron transport region ETR may include, for example, tris(8-hydroxyquinolinato)aluminum ($Alq_3$), 1,3,5-tri[(3-pyridyl)-phen-3-yl]benzene, 2,4,6-tris(3'-(pyridin-3-yl)biphenyl-3-yl)-1,3,5-triazine, 2-(4-(N-phenylbenzoimidazolyl-1-ylphenyl)-9,10-dinaphthylanthracene, 1,3,5-tris(1-phenyl-1H-benzo[d]imidazol-2-yl)benzene (TPBi), 2,9-dimethyl-4,7-diphenyl-1,10-phenanthroline (BCP), 4,7-diphenyl-1,10-phenanthroline (Bphen), 3-(4-biphenylyl)-4-phenyl-5-tert-butylphenyl-1,2,4-triazole (TAZ), 4-(naphthalen-1-yl)-3,5-diphenyl-4H-1,2,4-triazole (NTAZ), 2-(4-biphenylyl)-5-(4-tert-butylphenyl)-1,3,4-oxadiazole (tBu-PBD), bis(2-methyl-8-quinolinolato-N1,O8)-(1,1'-biphenyl-4-olato) aluminum (BAlq), berylliumbis(benzoquinolin-10-olate ($Bebq_2$), 9,10-di(naphthalene-2-yl)anthracene (ADN), or a mixture thereof. The thickness of the electron transport layer ETL may be from about 100 Å to about 1,000 Å, for example, from about 150 Å to about 500 Å. When the thickness of the electron the hole layer ETL satisfies the above-described range(s), satisfactory (or suitable) electron transport characteristics may be achieved without a substantial increase in driving voltage.

If the electron transport region ETR includes the electron injection layer EIL, the electron transport region ETR may be formed using metal halides (such as LiF, NaCl, CsF, RbCl, and/or RbI), lanthanum metals (such as Yb), metal oxides such as ($Li_2O$ and/or BaO), lithium quinolate (LiQ), etc., but embodiments are not limited thereto. The electron injection layer EIL may be also formed of a mixture of an electron transport material and an organo metal salt. The organo metal salt may be a material having an energy band gap of about 4 eV or more. For example, the organo metal salt may include metal acetate, metal benzoate, metal acetoacetate, metal acetylacetonate, or metal stearate. The electron injection layers EIL may have a thickness from about 1 Å to about 100 Å, for example, from about 3 Å to about 90 Å. When the thickness of the electron injection layer EIL satisfies the above-described range(s), satisfactory (or suitable) electron injection characteristics may be achieved without a substantial increase in driving voltage.

As described above, the electron transport region ETR may include the hole blocking layer HBL. The hole blocking layer HBL may include, for example, at least one of 2,9-dimethyl-4,7-diphenyl-1,10-phenanthroline (BCP), or 4,7-diphenyl-1,10-phenanthroline (Bphen), but is not limited thereto.

The second electrode EL2 is provided on the electron transport region ETR. The second electrode EL2 may be a common electrode and/or a negative electrode. The second electrode EL2 may be a transmissive electrode, a transflective electrode, or a reflective electrode. When the second electrode EL2 is the transmissive electrode, the second electrode EL2 may be formed of transparent metal oxide(s), for example, indium tin oxide (ITO), indium zinc oxide (IZO), zinc oxide (ZnO), indium tin zinc oxide (ITZO), etc.

When the second electrode EL2 is the transflective electrode or the reflective electrode, the second electrode EL2 may include Ag, Mg Cu, Al, Pt, Pd, Au, Ni, Nd, Ir, Cr, $L_1$, Ca, LiF/Ca, LiF/Al, Mo, Ti, or a compound or mixture thereof (e.g., a mixture of Ag and Mg). In some embodiments, the first electrode EU may have a multi-layered structure including a reflective layer or transflective layer and a transparent conductive layer formed of indium tin oxide (ITO), indium zinc oxide (IZO), zinc oxide (ZnO), and/or indium tin zinc oxide (ITZO).

In some embodiments, the second electrode EL may be connected to an auxiliary electrode. When the second electrode EL2 is connected to the auxiliary electrode, resistance of the second electrode EL2 may be decreased.

In some embodiments, a capping layer may be further provided on the second electrode EL2 of the organic electroluminescence device 10 of an embodiment. The capping layer may include, for example, α-NPD, NPB, TPD, m-MTDATA, $Alq_3$, CuPc, N4,N4,N4',N4'-tetra(biphenyl-4-yl)biphenyl-4,4'-diamine (TPD15), tris(4-carbazoyl-9-ylphenyl) amine (TCTA), N,N'-bis(naphthalen-1-yl), etc.

The above-described organometallic compound of an embodiment may be included as a material for the organic electroluminescence device 10 in a functional layer, as well as the emission layer EML. The organic electroluminescence device 10 of an embodiment of the present disclosure may also include the above-described organometallic compound in at least one functional layer between the first electrode EL1 and the second electrode EL2, and/or the capping layer on the second electrode EL2.

In the organic electroluminescence device 10, as voltage is applied to the first electrode EL1 and the second electrode EL2, respectively, the holes injected from the first electrode EL1 are moved through the hole transport region HTR to the emission layer EML, and the electrons injected from the second electrode EL2 are moved through the electron transport region ETR to the emission layer EML. The electrons and holes are recombined in the emission layer EML to generate excitons and emit light when the excitons return to a ground state from an excited state.

Hereinafter, with reference to Examples and Comparative Examples, the organometallic compound according to an embodiment of the present disclosure will be described in more detail. However, Examples shown below are illustrations provided only for the understanding of the present disclosure, and the scope of the present disclosure is not limited thereto.

The organometallic compound according to an embodiment of the present disclosure may be synthesized, for example, as follows. However, a synthetic method of the organometallic compound according to an embodiment of the present disclosure is not limited thereto.

1-1. Synthesis of Compound 1

An organometallic compound 1 according to an embodiment of the present disclosure may be synthesized by, for example, Reaction Formula 1-A to Reaction Formula 1-C below:

[Reaction Formula 1-A]

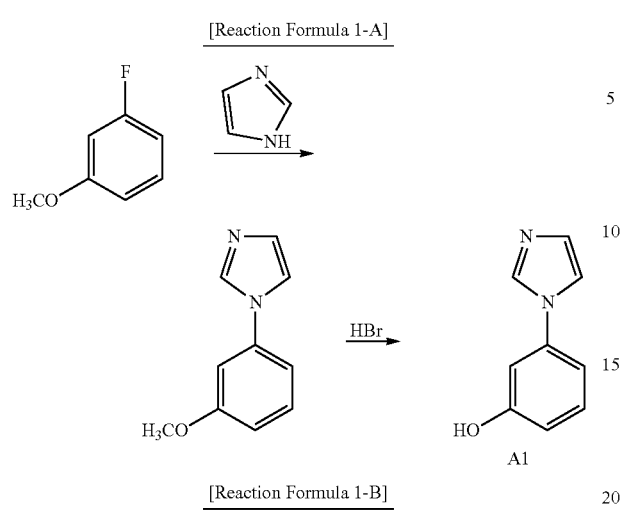

[Reaction Formula 1-B]

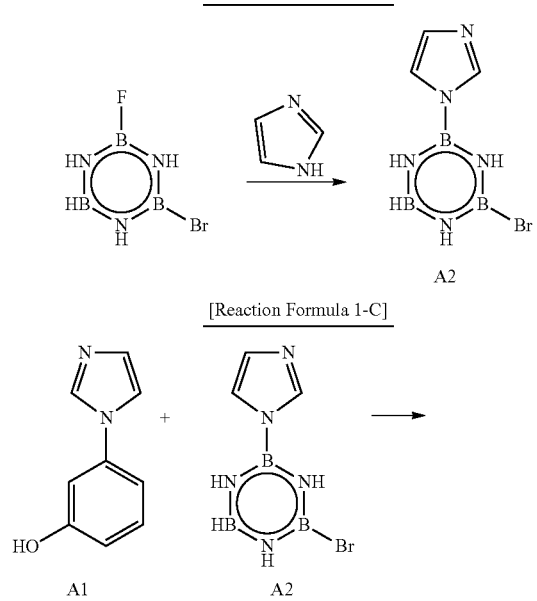

[Reaction Formula 1-C]

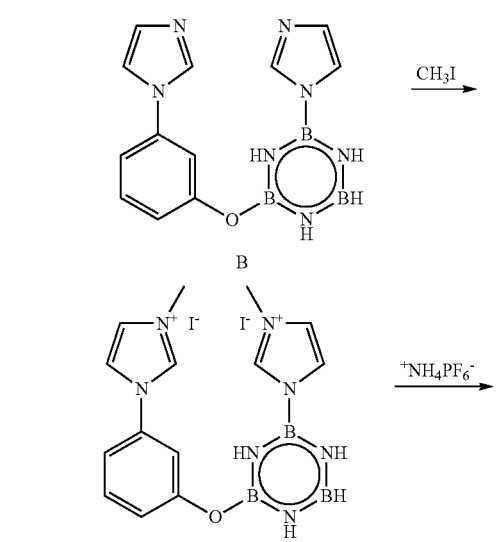

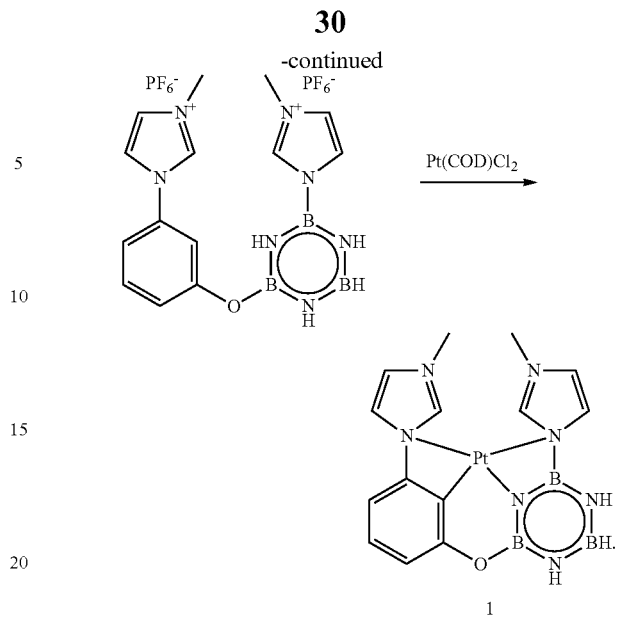

(Synthesis of Intermediate A1)

Imidazole (1.2 eq), 3-Fluorophenol (1.0 eq), KOH (2 mmol), and Cu$_2$O/ZnO nanoflake catalyst (0.01 g) were added to a DMSO solution, and stirred at 100° C. for 3 hours until the reactants were completely consumed. After HBr is added to the reaction mixture, reacted, and then cooled to room temperature. And the reaction mixture was extracted three times using ethyl acetate and water to separate and obtain an organic layer from the mixture layer. The obtained organic layer was dried using Na$_2$SO$_4$, and then enriched to obtain Intermediate Compound A1 (yield 75%) using a silica gel column chromatography.

(Synthesis of Intermediate A2)

Imidazole (1.2 eq), 1-bromo-3-fluoroborazine (1.0 eq), KOH (2 mmol), and Cu$_2$O/ZnO nanoflake catalyst (0.01 g) were added to a DMSO solution, and stirred at 100° C. for 3 hours until the reactants were completely consumed. The reaction mixture was cooled to room temperature, and then extracted three times using ethyl acetate and water to separate and obtain an organic layer from the mixture layer. The obtained organic layer was dried using Na$_2$SO$_4$, and then enriched to obtain Intermediate Compound A2 (yield 61%) using a silica gel column chromatography.

(Synthesis of Compound 1)

Intermediate Compound A1 (1.2 eq), Intermediate Compound A2 (1.0 eq), CuI (0.02 eq), K$_2$CO$_3$ (2.0 eq), and L-proline (0.04 eq) were dissolved in DMSO (0.1 M), and then stirred at 160° C. for 48 hours. The reaction mixture was cooled to room temperature, and then extracted three times using CH$_2$Cl$_2$ and water to obtain an organic layer. The obtained organic layer was dried using Na$_2$SO$_3$, and then enriched to obtain Intermediate B (yield 32%) using a silica gel column chromatography. In addition to Intermediate B, CH$_3$I (1.5 eq) and CuOAc (0.1 eq) were dissolved in toluene (0.1 M), and then stirred at 110° C. for 12 hours. The reaction mixture was cooled to room temperature, and the solvent was then removed, and the reaction mixture was filtered and washed with diethyl ether to obtain an intermediate ligand compound (yield 85%). The obtained intermediate ligand compound (1.0 eq), dichloro(1,5-cyclooctadienyl) plantinum (II) (1.05 eq), and sodium acetate (3.0 eq) were dissolved in tetrahydrofuran (0.1 M), and then stirred at 120° C. for 72 hours in nitrogen atmosphere. The resultant product was cooled to room temperature, and then the solvent was removed at reduced pressure. The enriched resultant product was dissolved in dichlorometane, and the remaining precipitate was filtered by filtration. The filtrate was purified using a silica gel column chromatography to obtain Compound 1 (yield 20%).

1-2. Synthesis of Compound 2

The organometallic compound 2 according to an embodiment of the present disclosure may be synthesized by, for example, Reaction Formula 2-A and 2-B below:

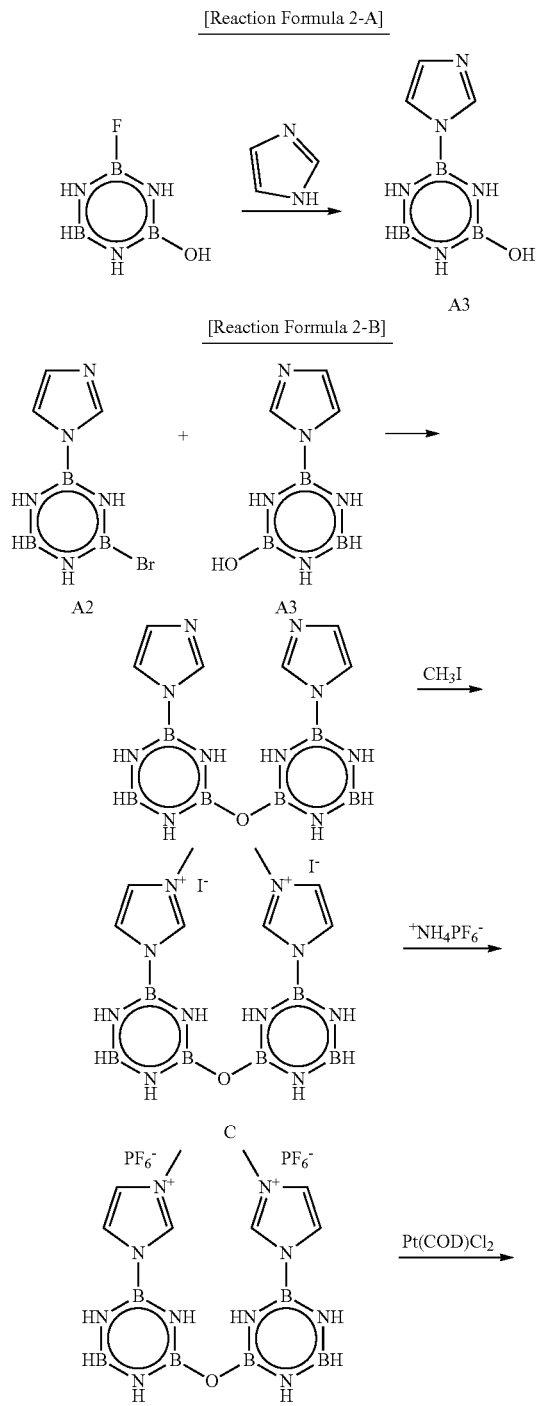

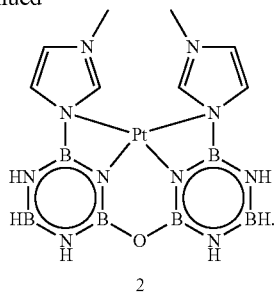

(Synthesis of Intermediate A3)

Imidazole (1.2 eq), 3-fluoro-1-hydroxylborazine (1.0 eq), KOH (2 mmol), and Cu$_2$O/ZnO nanoflake catalyst (0.01 g) were added to a DMSO solution, and stirred at 100° C. for 3 hours until the reactants were completely consumed. The reaction mixture was cooled to room temperature, and then extracted three times using ethyl acetate and water to separate and obtain an organic layer from the mixture layer. The obtained organic layer was dried using Na$_2$SO$_4$, and then enriched to obtain Intermediate Compound A3 (yield 54%) using a silica gel column chromatography.

(Synthesis of Compound 2)

Intermediate Compound A2 (1.0 eq), Intermediate Compound A3 (1.2 eq), CuI (0.02 eq), K$_2$CO$_3$ (2.0 eq), and L-proline (0.04 eq) were dissolved in DMSO (0.1 M), and then stirred at 160° C. for 48 hours. The reaction mixture was cooled to room temperature, and then extracted three times using CH$_2$Cl$_2$ and water to obtain an organic layer. The obtained organic layer was dried using Na$_2$SO$_4$, and then enriched to obtain Intermediate C (yield 32%) using a silica gel column chromatography. In addition to this, CH$_3$I (1.5 eq) and CuOAc (0.1 eq) were dissolved in toluene (0.1 M), and then stirred at 110° C. for 12 hours. The reaction mixture was cooled to room temperature, and the solvent was then removed, and the reaction mixture was filtered and washed with diethyl ether to obtain an intermediate ligand compound (yield 60%). The obtained intermediate ligand compound (1.0 eq), dichloro(1,5-cyclootadienyl) plantinum (II) (1.05 eq), and sodium acetate (3.0 eq) were dissolved in tetrahydrofuran (0.1 M), and then stirred at 120° C. for 72 hours under nitrogen atmosphere. The resultant product was cooled to room temperature, and then the solvent was removed at reduced pressure. The enriched resultant product was dissolved in dichloromethane, and the remaining precipitate was filtered by filtration. The filtrate was purified using a silica gel column chromatography to obtain Compound 2 (yield 12%).

1-3. Synthesis of Compound 9

The organometallic Compound 9 according to an embodiment of the present disclosure may be synthesized by, for example, Reaction Formula 3-A to Reaction Formula 3-C below:

[Reaction Formula 3-A]

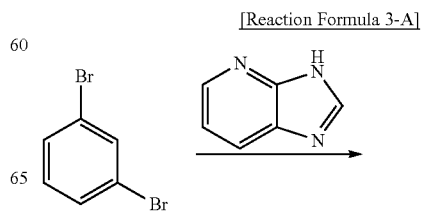

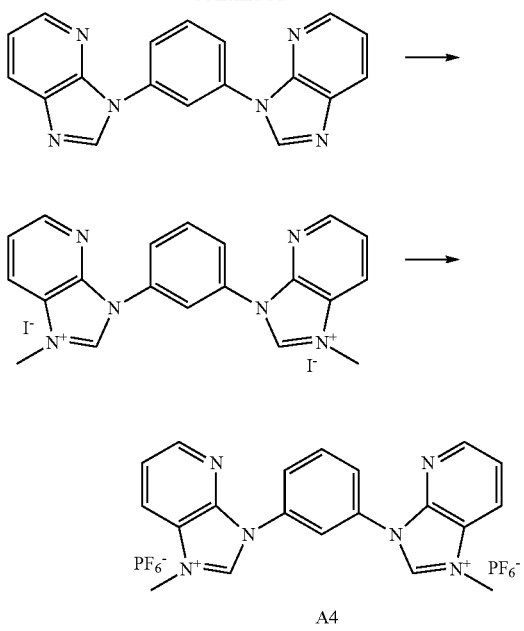

A4

[Reaction Formula 3-B]

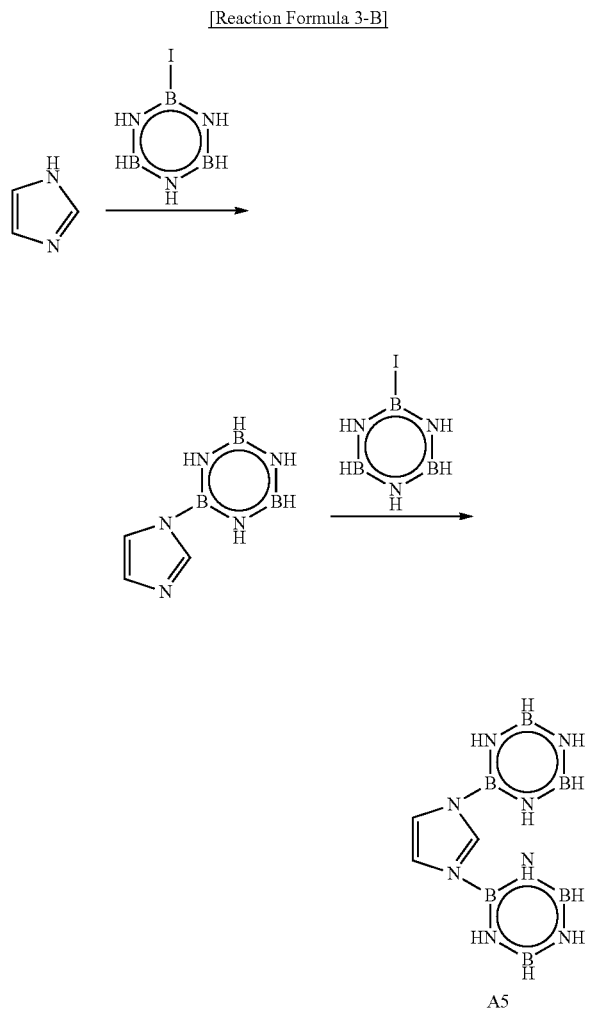

A5

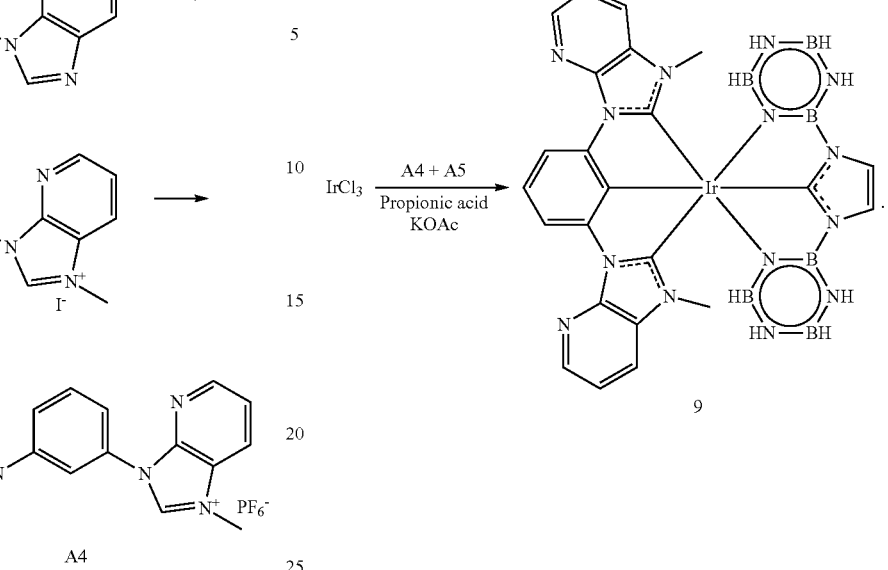

[Reaction Formula 3-C]

9

(Synthesis of Intermediate A4)

1,3-dibromobenzene (1.0 eq), 3H-imidazo[4,5-b]pyridine (3.0 eq), CuPF$_6$ (0.02 eq), K$_2$CO$_3$ (3.0 eq), and L-proline (0.04 eq) were dissolved in dimethylsulfonate (0.1 M), and then stirred at 160° C. for 48 hours. The reaction mixture was cooled to room temperature, and then extracted three times using ethyl acetate and water to obtain an organic layer. The obtained organic layer was dried using Na$_2$SO$_4$, and then enriched to obtain Intermediate Compound A4 (yield 43%) using a silica gel column chromatography.

(Synthesis of Intermediate A5)

Imidazole (1.0 eq), 2-iodo-1,3,5,2,4,6-triazatriborinane (2.0 eq), KOH (2 mmol), and Cu$_2$O/ZnO nanoflake catalyst (0.01 g) were added to a DMSO solution, and stirred at 100° C. for 3 hours until the reactants were completely consumed. The reaction mixture was cooled to room temperature, and then extracted three times using ethyl acetate and water to separate and obtain an organic layer from the mixture layer. The obtained organic layer was dried using Na$_2$SO$_4$, and then enriched to obtain Intermediate Compound A5 (yield 71%) using a silica gel column chromatography.

(Synthesis of Compound 9)

Intermediate Compound A4(1.0 eq), Intermediate Compound A5, I2 (1.0 eq), iridium chloride hydrate (1.1 eq), and KOAc (10 eq) were dissolved in propionic acid (0.2 M), and then stirred at 140° C. for 12 hours. The resultant product was cooled to room temperature, and then the solvent was removed at reduced pressure. Then, the resultant product was extracted three times using ethyl acetate and water to obtain an organic layer. The obtained organic layer was dried with Na$_2$SO$_4$, and then enriched to synthesize Compound 9 (yield 11%) using a column chromatography.

1-4. Synthesis of Compound 15

The organometallic Compound 15 according to an embodiment of the present disclosure may be synthesized by, for example, Reaction Formula 4-A to Reaction Formula 4-C below:

[Reaction Formula 4-A]

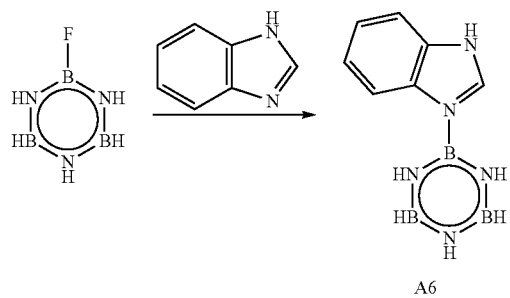

A6

[Reaction Formula 4-B]

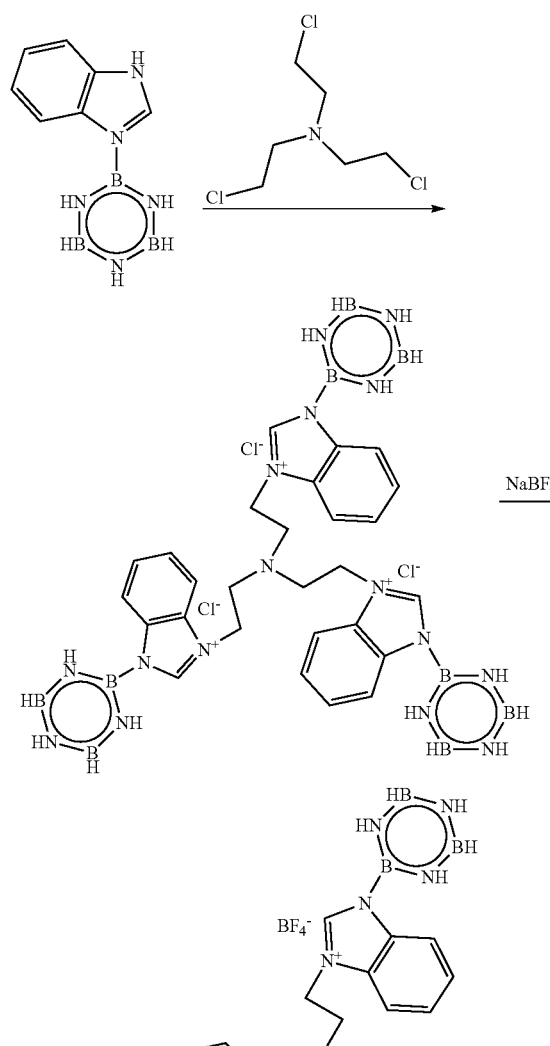

A7

[Reaction Formula 4-C]

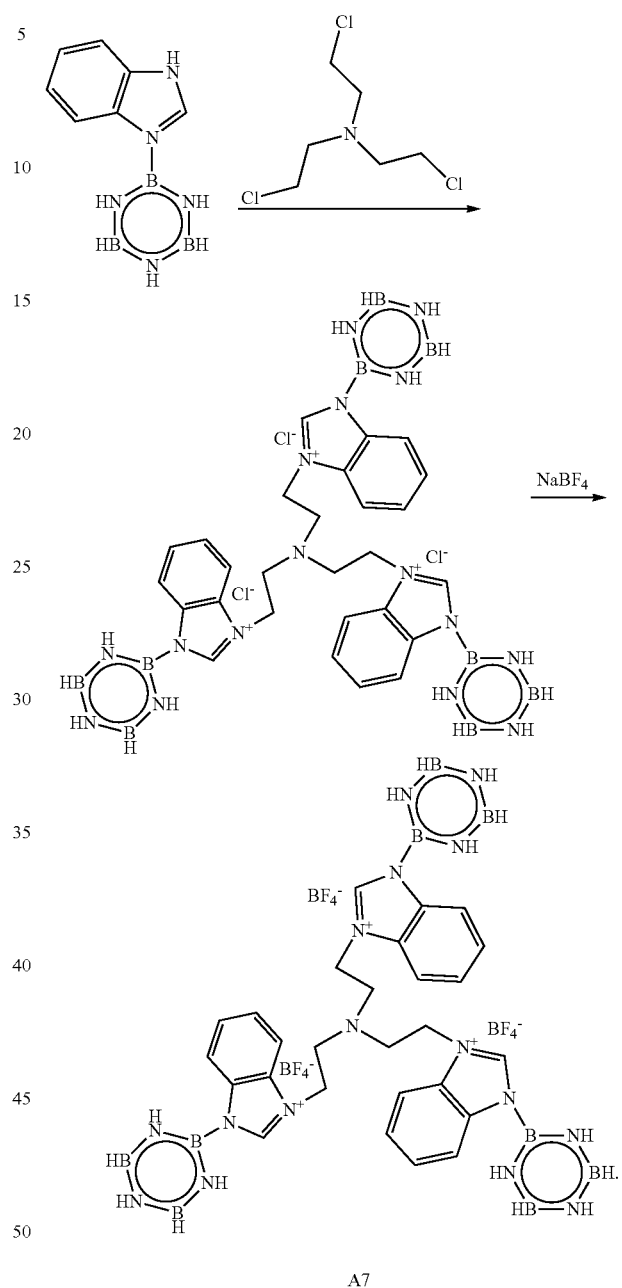

A7

(Synthesis of Intermediate A6)

3H-imidazo[4,5-b]benzene (1.2 eq), fluoroborazine (1.0 eq), KOH (2 mmol), and $Cu_2O$/ZnO nanoflake catalyst (0.01 g) were added to a DMSO solution, and stirred at 100° C. for 3 hours until the reactants were completely consumed. After the reaction was completed, Cl⁻ leaving group was substituted using $NaBF_4$ (3 eq), and the reaction mixture was cooled to room temperature, and then extracted three times using ethyl acetate and water to separate and obtain an organic layer from the mixture layer. The obtained organic layer was dried using $Na_2SO_4$, and then enriched to obtain Intermediate Compound A6 (yield 43%) using a column chromatography.

(Synthesis of Intermediate A7)

Intermediate A6 (3.0 eq), tris-chloroethylamine (1.0 eq), KOH (2 mmol), and Cu$_2$O/ZnO nanoflake catalyst (0.01 g) were added to a DMSO solution, and stirred at 100° C. for 3 hours until the reactants were completely consumed. The reaction mixture was cooled to room temperature, and then extracted three times using ethyl acetate and water to separate and obtain an organic layer from the mixture layer. The obtained organic layer was dried using Na$_2$SO$_4$, and then enriched to obtain Intermediate Compound A7 (yield 31%) using a silica gel column chromatography.

(Synthesis of Compound 15)

Intermediate Compound A7 (1.0 eq), t-BuOK (3.0 eq), IrCl$_3$ (III), and sodium amalgam (3.0 eq) were dissolved in tetrahydrofuran (0.1 M), and then stirred at 120° C. for 72 hours in nitrogen atmosphere. The reaction mixture was cooled to room temperature, and then the solvent was removed at reduced pressure. The enriched resultant product was dissolved in dichlorometane, and the remaining precipitate was filtered by filtration. The filtrate was purified using a column chromatography to obtain Compound 15 (yield 15%).

1-5. Synthesis of Compound 3

Substantially the same method as a synthetic method of Compound 1 was performed to synthesize Compound 3, except that Intermediate Compound A8 (1.2 eq) and Intermediate Compound A9 (1.2 eq) below were used instead of Intermediate Compound A1 and Intermediate Compound A2, respectively.

A8

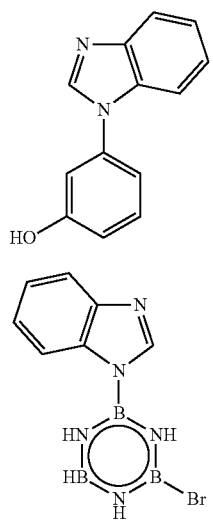

A9

1-6. Synthesis of Compound 4

Substantially the same method as a synthetic method of Compound 3 was performed to synthesize Compound 4, except that Intermediate Compound A10 (1.3 eq) was used instead of Intermediate Compound A8.

A10

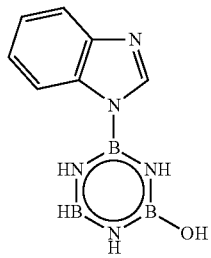

1-7. Synthesis of Compound 5

[Reaction Formula 5-A]

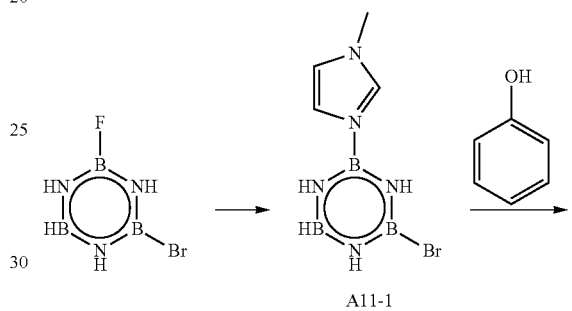

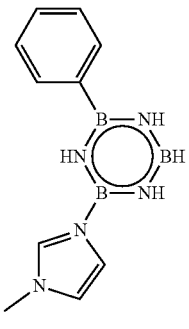

A11

(Synthesis of Intermediate A11)

1-methylimidazole (1.2 eq), 1-bromo-3-fluoroborazine (1.0 eq), KOH (2 mmol), and Cu$_2$O/ZnO nanoflake catalyst (0.01 g) were added to a DMSO solution, and stirred at 100° C. for 3 hours until the reactants were completely consumed. The reaction mixture was cooled to room temperature, and then extracted three times using ethyl acetate and water to separate and obtain an organic layer from the mixture layer. The obtained organic layer was dried using Na$_2$SO$_4$, and then enriched to obtain Intermediate Compound A11-1 (yield 75%) using a silica gel column chromatography.

Then, phenol (1.2 eq), Intermediate Compound A11-1 (1.0 eq), CuI (0.02 eq), K$_2$CO$_3$ (2.0 eq), and L-proline (0.04 eq) were dissolved in DMSO (0.1 M), and then stirred at 160° C. for 48 hours. The reaction mixture was cooled to room temperature, and then extracted three times using CH$_2$Cl$_2$ and water to obtain an organic layer. The obtained organic layer was dried with Na$_2$SO$_3$, and then enriched to obtain Intermediate A11 (yield 32%) using a silica gel column chromatography.

(Synthesis of Compound 5)

Substantially the same method as a synthetic method of Compound 9 was performed to synthesize Compound 5, except that Intermediate Compound A12 (1.2 eq) below and Intermediate Compound A11 (1.3 eq) above were used instead of Intermediate Compound A4 and Intermediate Compound A5, respectively.

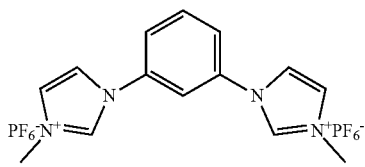

A12

1-8. Synthesis of Compound 6

Substantially the same method as a synthetic method of Compound 5 was performed to synthesize Compound 6, except that Intermediate Compound A13 (1.1 eq) below was used instead of Intermediate Compound A12.

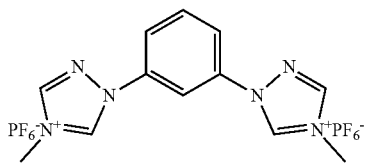

A13

1-9. Synthesis of Compound 7

Substantially the same method as a synthetic method of Compound 5 was performed to synthesize Compound 7, except that Intermediate Compound A14 (1.1 eq) below and Intermediate Compound A15 (1.1 eq) below were used instead of Intermediate Compound A11 and Intermediate Compound A12, respectively.

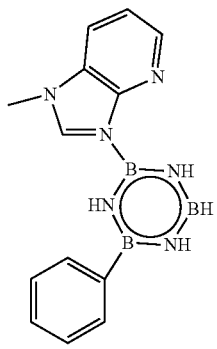

A14

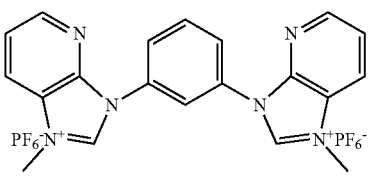

A15

1-10. Synthesis of Compound 8

Substantially the same method as a synthetic method of Compound 7 was performed to synthesize Compound 8, except that Intermediate Compound A16 (1.2 eq) below was used instead of Intermediate Compound A14.

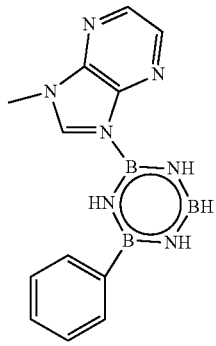

A16

1-11. Synthesis of Compound 10

Substantially the same method as a synthetic method of Compound 15 was performed to synthesize Compound 10, except that Intermediate Compound A17 (1.2 eq) below and 1,3,5-tris(2-chloroethyl)benzene (2.0 eq) were used instead of Intermediate Compound A6 and tris-chloroethylamine (1.0 eq), respectively.

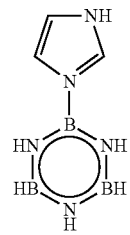

A17

1-12. Synthesis of Compound 11

Substantially the same method as a synthetic method of Compound 15 was performed to synthesize Compound 11, except that Intermediate Compound A16 (1.3 eq) was used instead of Intermediate Compound A6.

1-13. Synthesis of Compound 12

Substantially the same method as a synthetic method of Compound 15 was performed to synthesize Compound 12, except that Intermediate Compound A16 (1.3 eq) and 1,5-dichloro-3-(2-chloroethyl)pentane (2.0 eq) were used instead of Intermediate Compound A6 and tris-chloroethylamine (1.0 eq), respectively.

1-14. Synthesis of Compound 13

Substantially the same method as a synthetic method of Compound 15 was performed to synthesize Compound 13, except that 1,3,5-tris(2-chloroethyl)benzene (2.0 eq) were used instead of tris-chloroethylamine (1.0 eq).

1-15. Synthesis of Compound 14

Substantially the same method as a synthetic method of Compound 15 was performed to synthesize Compound 14, except that 1,5-dichloro-3-(2-chloroethyl)pentane (2.0 eq) was used instead of tris-chloroethylamine (1.0 eq).

2. Characteristic Evaluation of Organometallic Compound

Example Compounds

1
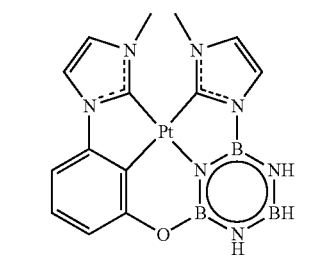

2
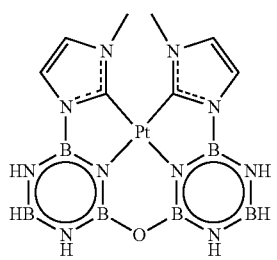

3
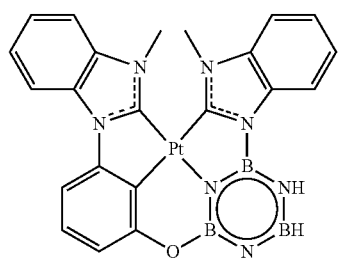

4
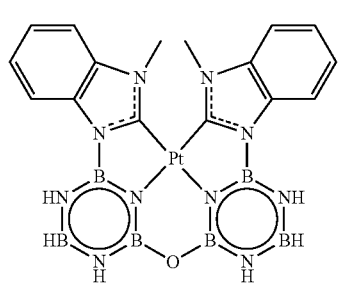

5
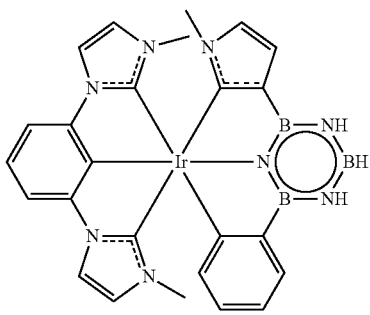

6
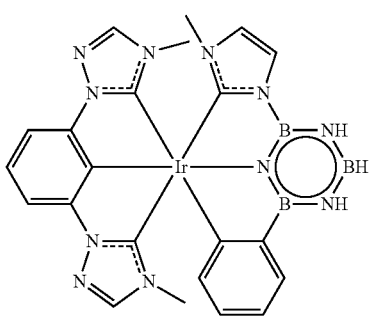

7
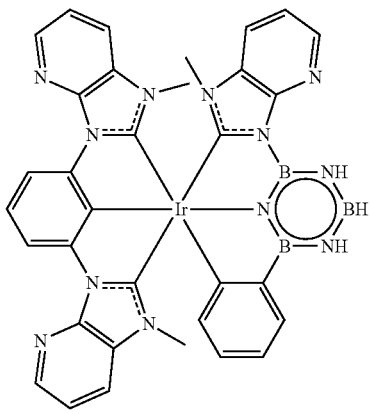

8
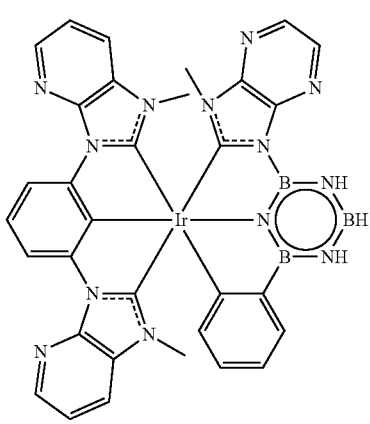

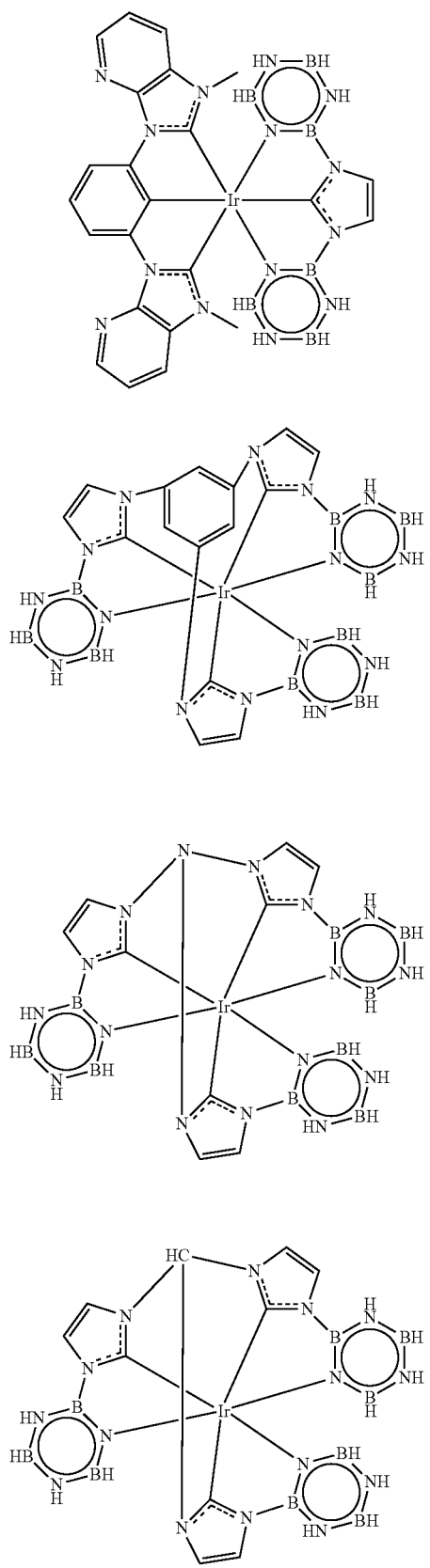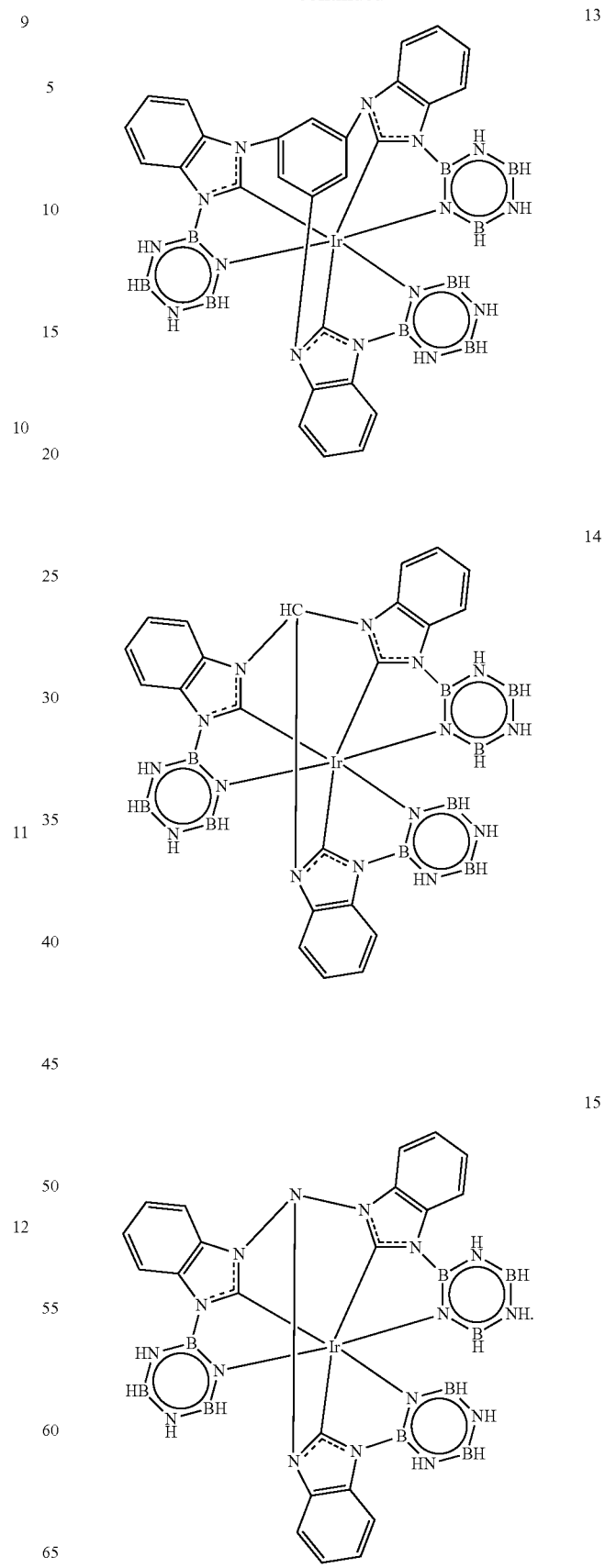

Comparative Example Compounds

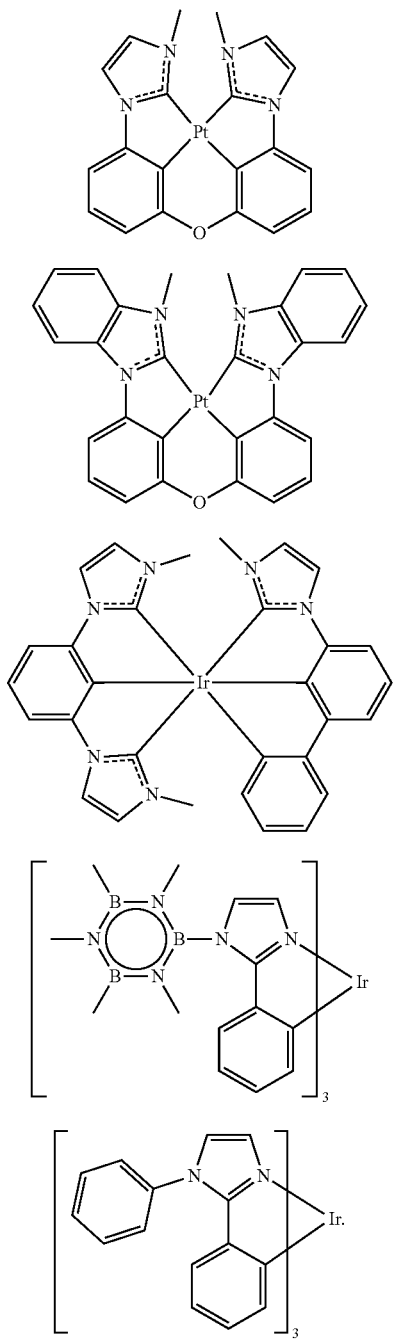

2-1. Measurement of Energy Level of Example Compounds 1 to 4

A HOMO energy level and a lowest unoccupied molecular orbital (LUMO) energy level with respect to Example Compounds 1 to 4, and Comparative Example Compounds C1 and C2 were measured by simulating on the basis of Density Functional Theory. Specifically, using Gaussian09 from Gaussian, Inc. and standard B3LYP method, rare earth metal such as Pt/Ir was described on the basis of effective core potential (ECP) function of Hay-Wadt, properties of the ground state of the remaining elements, such as C, H, N, O were calculated using 6-311G(d,p) basis set.

A $T_1$ energy level and $\Delta(T_1-{}^3MC)$ were calculated by simulating on the basis of Time Dependent Density Functional Theory and describing transition characteristics of triplet state and $^3MC$ state generated by ligand desorption. The unit of the measured values is all eV. The measured values are shown in Table 1 below.

TABLE 1

| Compound | HOMO | LUMO | $T_1$ | $\Delta(T_1 - {}^3MC)$ |
|---|---|---|---|---|
| 1 | −5.07 | −0.92 | 2.83 | 1.13 |
| 2 | −5.23 | −0.70 | 2.93 | 0.85 |
| 3 | −5.27 | −1.5 | 2.69 | 1.41 |
| 4 | −5.47 | −1.41 | 2.81 | 1.10 |
| C1 | −4.84 | −1.91 | 2.70 | 1.34 |
| C2 | −5.04 | −1.56 | 2.65 | 1.40 |

Referring to Table 1, with respect to the organometallic compound of an embodiment, a HOMO energy level may be lowered, while maintaining a LUMO energy level, T1 energy level, and $\Delta(T_1-{}^3MC)$ value at almost the same level, by controlling the number and position of borazine groups which are directly linked to the metal atom. Although $\Delta(T_1-{}^3MC)$ values in some Example Compounds are lower than that of Comparative Example Compounds, $\Delta(T_1-{}^3MC)$ values are still 0.85 or more for the Example Compounds, and thus the effect on life of compounds is minor. Because the organometallic compound of an embodiment has a deep HOMO energy level, TPQ may be reduced, and thus service life of the device may be increased.

2-2. Measurement of Energy Level of Example Compounds 5 to 14

A $T_1$ energy level and $\Delta(T_1-{}^3MC)$ with respect to Example Compounds 5 to 14, and Comparative Example Compounds C3 to C5 were measured by the same method as for Example Compounds 1 to 4 and Comparative Example Compounds C1 and C2. The unit of the measured values is all eV. The measured valued are shown in Table 2 below.

TABLE 2

| Compound | $T_1$ | $\Delta(T_1 - {}^3MC)$ |
|---|---|---|
| 5 | 3.16 | 0.12 |
| 6 | 3.45 | 0.02 |
| 7 | 2.86 | 0.32 |
| 8 | 2.68 | 0.63 |
| 9 | 2.83 | 0.62 |
| 10 | 2.95 | 0.71 |
| 11 | 2.80 | 0.88 |
| 12 | 2.93 | 0.74 |
| 13 | 2.79 | 0.92 |
| 14 | 2.96 | 0.71 |
| 15 | 2.76 | 0.94 |
| C3 | 2.83 | 0.10 |
| C4 | 2.79 | 0.12 |
| C5 | 2.56 | 0.092 |

Referring to Table 2, with respect to the organometallic compound of an embodiment, $T_1$ energy level and $\Delta(T_1-{}^3MC)$ may be suitably controlled by controlling the number and position of borazine groups which are directly linked to the metal atom. Referring to $T_1$ energy measurements, Example Compounds 5 to 7, 10 to 12, and 14 may emit light having a shorter wavelength than Comparative Example Compounds C3 to C5. Although Example Compound 5 has $\Delta(T_1-{}^3MC)$ equal to that of Comparative Example Compound C4, Example Compound 5 may emit light having a short wavelength. Example Compounds 7 to 15 have a high $\Delta(T_1-{}^3MC)$ value of 0.3 eV or more, or 0.6 eV or more (for Example Compounds 8 to 15), and thus the linkage between the metal atom and the ligand of the organometallic compound is not easily broken, thereby achieving long service life of a device. The organometallic compound of an embodiment has a ligand including at least one borazine group which is directly linked to the metal atom. Therefore, the organometallic compound of an embodiment may be applied to the emission layer of the organic electroluminescence device to achieve long service life.

The organic electroluminescence device according to an embodiment of the present disclosure may achieve long service life.

The organometallic compound according to an embodiment of the present disclosure may be used in the organic electroluminescence device to achieve long service life of the organic electroluminescence device.

The term "and/or" includes one or more combinations which may be defined by relevant elements. Expressions such as "at least one of," "one of," and "selected from," when preceding a list of elements, modify the entire list of elements and do not modify the individual elements of the list. Further, the use of "may" when describing embodiments of the present disclosure refers to "one or more embodiments of the present disclosure."

As used herein, the terms "use," "using," and "used" may be considered synonymous with the terms "utilize," "utilizing," and "utilized," respectively.

In addition, the terms "substantially," "about," and similar terms are used as terms of approximation and not as terms of degree, and are intended to account for the inherent deviations in measured or calculated values that would be recognized by those of ordinary skill in the art.

Also, any numerical range recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein.

Although the example embodiments of the present disclosure have been described, it is understood that various changes and modifications may be made by one of ordinary skill in the art within the spirit and scope of the present disclosure as hereinafter claimed. Also, the embodiments disclosed in the present disclosure are not intended to limit the technical ideas of the present disclosure, and all technical ideas within the following claims and their equivalents should be interpreted to be included in the scope of right in the present disclosure.

What is claimed is:

1. An organic electroluminescence device comprising:
a first electrode;
a hole transport region on the first electrode;
an emission layer on the hole transport region;
an electron transport region on the emission layer; and
a second electrode on the electron transport region,
wherein the emission layer comprises an organometallic compound comprising a metal atom and a ligand linked with the metal atom,
wherein the ligand comprises:
at least one substituted or unsubstituted borazine group directly linked to the metal atom; and
at least one selected from a substituted or unsubstituted aryl group having 6 to 30 carbon atoms for forming a ring, and a substituted or unsubstituted heteroaryl group having 1 to 30 carbon atoms for forming a ring group.

2. The organic electroluminescence device of claim 1, wherein the metal atom is a platinum (Pt) atom, an iridium (Ir) atom, a palladium (Pd) atom, or an osmium (Os) atom.

3. The organic electroluminescence device of claim 2, wherein the metal atom is a platinum atom, and the ligand is a tetradentate ligand, or
the metal atom is an iridium atom, and the ligand comprises two tridentate ligands or one hexadentate ligand.

4. The organic electroluminescence device of claim 1, wherein the substituted or unsubstituted aryl group is a substituted or unsubstituted benzene derivative, and
the substituted or unsubstituted heteroaryl group is a substituted or unsubstituted aromatic carbene derivative.

5. The organic electroluminescence device of claim 1, wherein the emission layer is to emit light having a center wavelength of about 420 nm to about 470 nm via phosphorescence luminescence.

6. The organic electroluminescence device of claim 1, wherein the emission layer comprises a host and a dopant, and
the dopant comprises the organometallic compound.

7. The organic electroluminescence device of claim 1, wherein a difference ($\Delta(T_1-{}^3MC)$) between $T_1$ energy level and ${}^3MC$ energy level of the organometallic compound is about 0.3 eV or more.

8. The organic electroluminescence device of claim 1, wherein the organometallic compound is represented by Formula 1 or Formula 2:

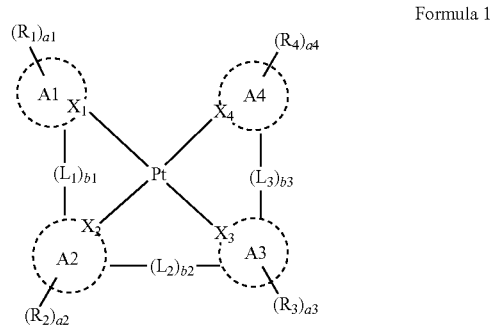

Formula 1

-continued

Formula 2

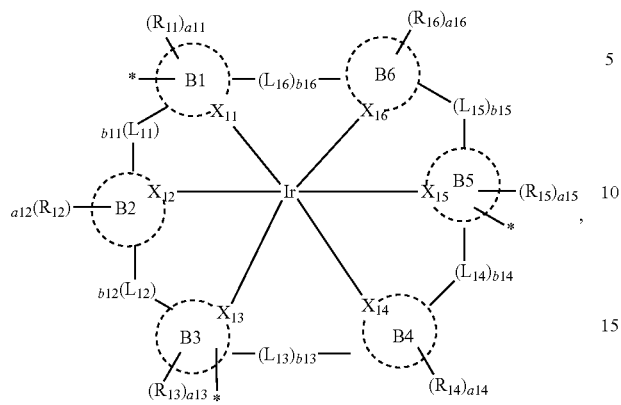

wherein, in Formula 1 and Formula 2,
$X_1$ to $X_4$ and $X_{11}$ to $X_{16}$ are each independently a carbon atom or a nitrogen atom,
A1 to A4 and B1 to B6 are each independently a substituted or unsubstituted aryl group having 6 to 30 carbon atoms for forming a ring, or a substituted or unsubstituted heteroaryl group having 1 to 30 carbon atoms for forming a ring,
at least one selected from A1 to A4, and at least one selected from B1 to B6, are a substituted or unsubstituted borazine group,
$R_1$ to $R_4$ and $R_{11}$ to $R_{16}$ are each independently a hydrogen atom, a deuterium atom, a substituted or unsubstituted alkyl group having 1 to 20 carbon atoms, a substituted or unsubstituted aryl group having 6 to 30 carbon atoms for forming a ring, or a substituted or unsubstituted heteroaryl group having 1 to 30 carbon atoms for forming a ring, and any of $R_1$ to $R_4$ and $R_{11}$ to $R_{16}$ are optionally combined with an adjacent group to form a ring,
a1 to a4 and a11 to a16 are each independently an integer of 0 to 3,
$L_1$ to $L_3$ and $L_{11}$ to $L_{16}$ are each independently a direct linkage, *—O—*, *—S—*, a substituted or unsubstituted divalent alkyl group having 1 to 20 carbon atoms, a substituted or unsubstituted arylene group having 6 to 30 carbon atoms for forming a ring, or a substituted or unsubstituted heteroarylene group having 1 to 30 carbon atoms for forming a ring,
b1 to b3 and b11 to b16 are each independently 0 or 1, and
in Formula 2, B1, B3, and B6 are optionally linked to a linker represented by Formula 2A:

Formula 2A

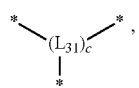

wherein, in Formula 2A,
$L_{31}$ is a nitrogen atom, a substituted or unsubstituted trivalent alkyl group having 1 to 20 carbon atoms, a substituted or unsubstituted trivalent aryl group having 6 to 30 carbon atoms for forming a ring, or a substituted or unsubstituted trivalent heteroaryl group having 1 to 30 carbon atoms for forming a ring, and
c is 0 or 1.

9. The organic electroluminescence device of claim 8, wherein A1 to A4 and B1 to B6 are each independently any one selected from LG1 to LG3:

LG1

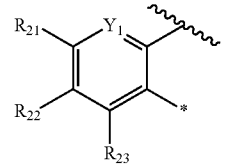

LG2

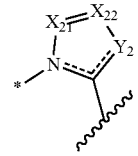

LG3

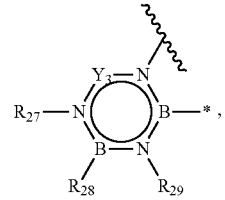

wherein, in LG1 to LG3,
$X_{21}$ and $X_{22}$ are each independently $CR_{24}$, or a nitrogen atom,
$Y_1$ is $CR_{25}$ or C—*,
$Y_2$ is $NR_{26}$ or N—,
$Y_3$ is B or B—*, and
$R_{21}$ to $R_{29}$ are each independently a hydrogen atom, a deuterium atom, a substituted or unsubstituted alkyl group having 1 to 20 carbon atoms, a substituted or unsubstituted aryl group having 6 to 30 carbon atoms for forming a ring, or a substituted or unsubstituted heteroaryl group having 1 to 30 carbon atoms for forming a ring, and any of $R_{21}$ to $R_{29}$ are optionally combined with an adjacent group to form a ring.

10. The organic electroluminescence device of claim 9, wherein Formula 1 is represented by Formula 1-1:

Formula 1-1

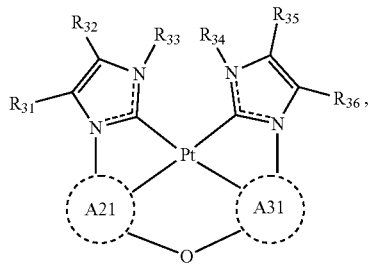

wherein, in Formula 1-1,
A21 and A31 are each independently LG1 or LG3, and at least one selected from A21 and A31 is LG3, and
$R_{31}$ to $R_{36}$ are each independently a hydrogen atom, a deuterium atom, a substituted or unsubstituted alkyl group having 1 to 20 carbon atoms, a substituted or unsubstituted aryl group having 6 to 30 carbon atoms for forming a ring, or a substituted or unsubstituted heteroaryl group having 1 to 30 carbon atoms for forming a ring, and any of $R_{31}$ to $R_{36}$ are optionally combined with an adjacent group to form a ring.

11. The organic electroluminescence device of claim 9, wherein Formula 2 is represented by Formula 2-1 or Formula 2-2:

Formula 2-1

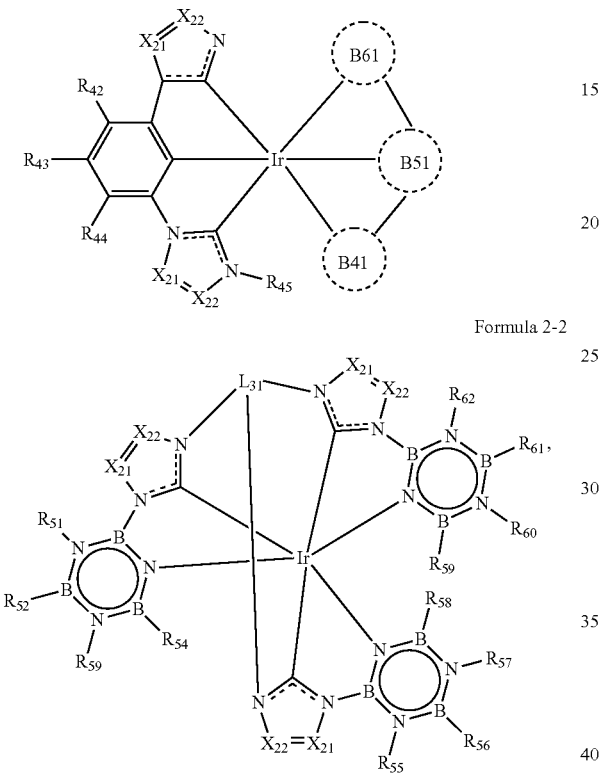

Formula 2-2 wherein, in Formula 2-1 and Formula 2-2,

B41 to B61 are each independently LG1, LG2, or LG3, and at least one selected from B41 to B61 is LG3, $R_{41}$ to $R_{45}$ are each independently a hydrogen atom, a deuterium atom, a substituted or unsubstituted alkyl group having 1 to 20 carbon atoms, a substituted or unsubstituted aryl group having 6 to 30 carbon atoms for forming a ring, or a substituted or unsubstituted heteroaryl group having 1 to 30 carbon atoms for forming a ring, and any of $R_{41}$ to $R_{45}$ are optionally combined with an adjacent group to form a ring, $R_{51}$ to $R_{62}$ are each independently a hydrogen atom, a deuterium atom, a substituted or unsubstituted alkyl group having 1 to 20 carbon atoms, a substituted or unsubstituted aryl group having 6 to 30 carbon atoms for forming a ring, or a substituted or unsubstituted heteroaryl group having 1 to 30 carbon atoms for forming a ring, and any of $R_{51}$ to $R_{62}$ are optionally combined with an adjacent group to form a ring, $L_{31}$ is the same as defined in Formula 2A, and $X_{21}$ and $X_{22}$ are the same as defined in LG2.

12. The organic electroluminescence device of claim 1, wherein the emission layer comprises at least one selected from compounds represented by Compound Group 1:

Compound Group 1

1

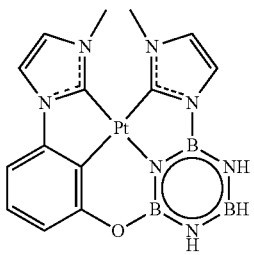

2

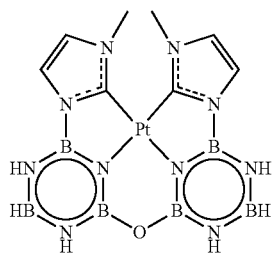

3

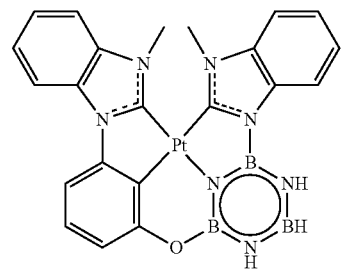

4

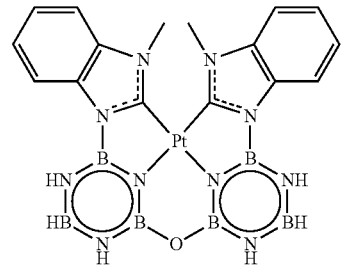

5

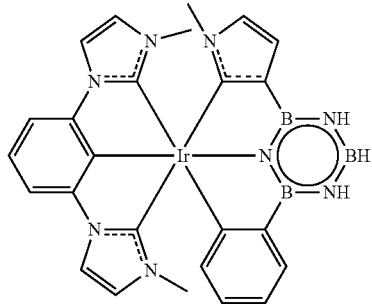

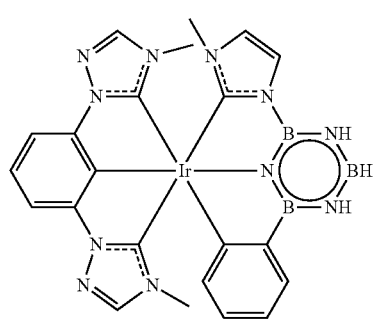
6
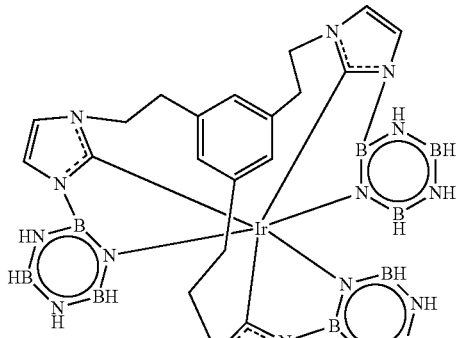
10
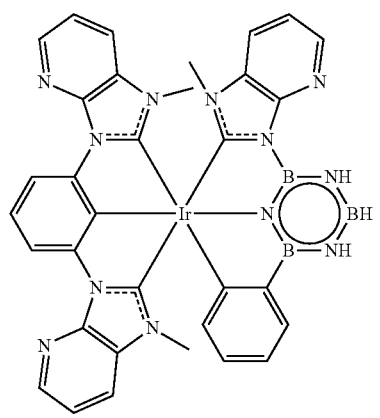
7
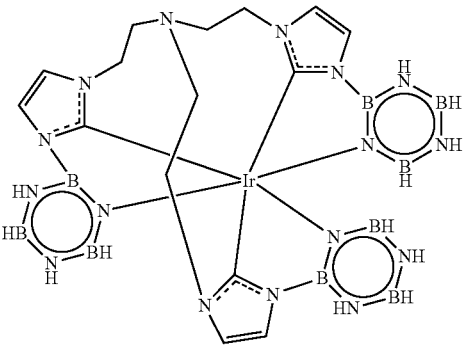
11
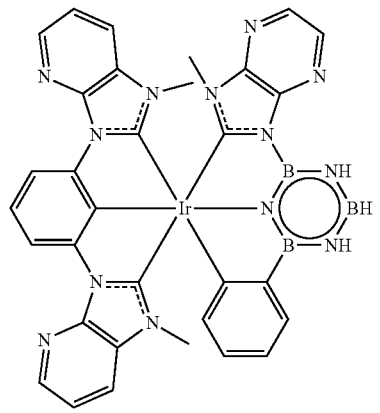
8
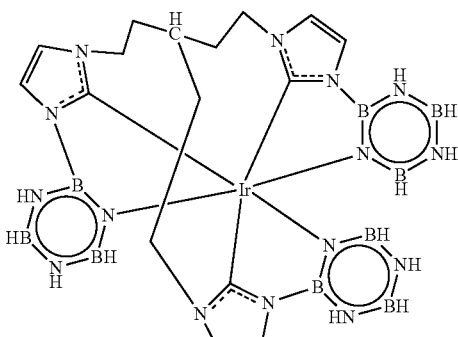
12
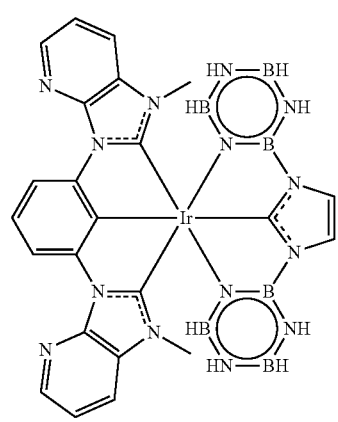
9
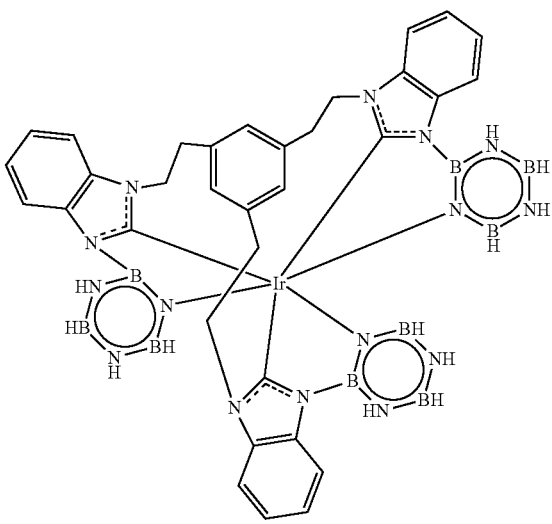
13

-continued

14

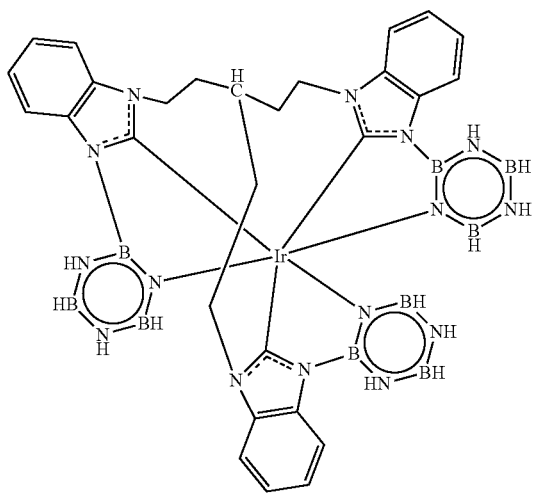

15

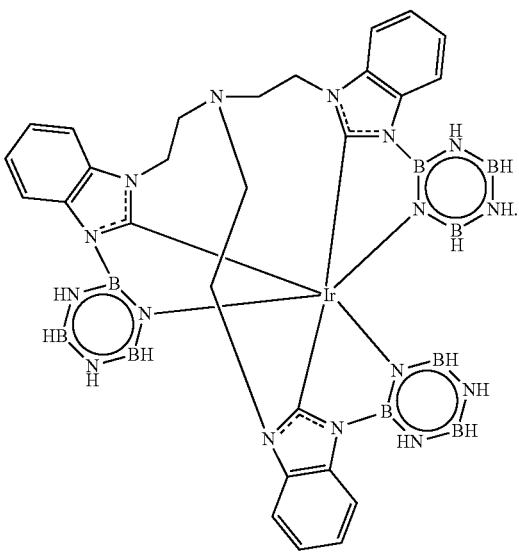

13. An organic electroluminescence device, comprising:
a first electrode;
a hole transport region on the first electrode;
an emission layer on the hole transport region;
an electron transport region on the emission layer; and
a second electrode on the electron transport region,
wherein the emission layer comprises an organometallic compound represented by Formula 1 or Formula 2:

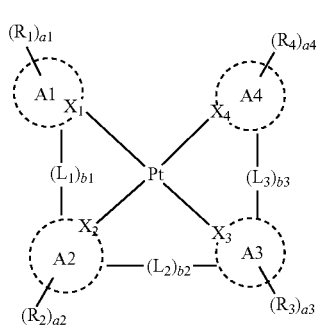

Formula 1

-continued

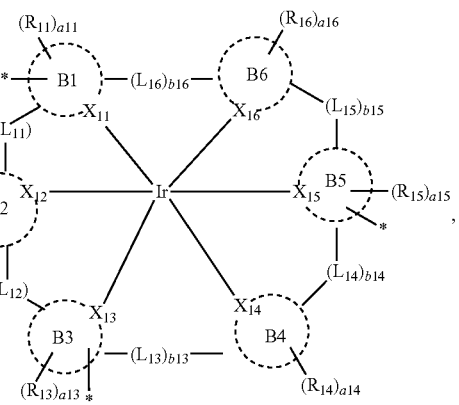

Formula 2 wherein, in Formula 1 and Formula 2, $X_1$ to $X_4$ and $X_{11}$ to $X_{16}$ are each independently a carbon atom or a nitrogen atom, A1 to A4 and B1 to B6 are each independently a substituted or unsubstituted aryl group having 6 to 30 carbon atoms for forming a ring, or a substituted or unsubstituted heteroaryl group having 1 to 30 carbon atoms for forming a ring, at least one selected from A1 to A4, and at least one selected from B1 to B6, are a substituted or unsubstituted borazine group, $R_1$ to $R_4$ and Rug to $R_{16}$ are each independently a hydrogen atom, a deuterium atom, a substituted or unsubstituted alkyl group having 1 to 20 carbon atoms, a substituted or unsubstituted aryl group having 6 to 30 carbon atoms for forming a ring, or a substituted or unsubstituted heteroaryl group having 1 to 30 carbon atoms for forming a ring, and any of $R_1$ to $R_4$ and Rug to $R_{16}$ are optionally combined with an adjacent group to form a ring, a1 to a4 and a11 to a16 are each independently an integer of 0 to 3, $L_1$ to $L_3$ and $L_{11}$ to $L_{16}$ are each independently a direct linkage, *—O—*, *—S—*, a substituted or unsubstituted divalent alkyl group having 1 to 20 carbon atoms, a substituted or unsubstituted arylene group having 6 to 30 carbon atoms for forming a ring, or a substituted or unsubstituted heteroarylene group having 1 to 30 carbon atoms for forming a ring, b1 to b3 and b11 to b16 are each independently 0 or 1, and in Formula 2, B1, B3, and B6 are optionally linked to a linker represented by Formula 2A:

Formula 2A wherein, in Formula 2A, $L_{31}$ is a nitrogen atom, a substituted or unsubstituted trivalent alkyl group having 1 to 20 carbon atoms, a substituted or unsubstituted trivalent aryl group having 6 to 30 carbon atoms for forming a ring, or a substituted or unsubstituted trivalent heteroaryl group having 1 to 30 carbon atoms for forming a ring, and c is 0 or 1.

14. The organic electroluminescence device of claim 13, wherein A1 to A4 and B1 to B6 are each independently any one selected from LG1 to LG3:

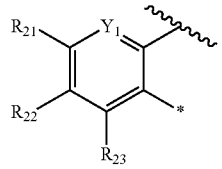

LG1

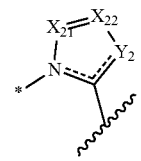

LG2

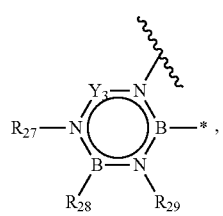

LG3 wherein, in LG1 to LG3, $X_{21}$ and $X_{22}$ are each independently $CR_{24}$, or a nitrogen atom, $Y_1$ is $CR_{25}$ or C—*, $Y_2$ is $NR_{26}$ or N—, $Y_3$ is B or B—*, and $R_{21}$ to $R_{27}$ are each independently a hydrogen atom, a deuterium atom, a substituted or unsubstituted alkyl group having 1 to 20 carbon atoms, a substituted or unsubstituted aryl group having 6 to 30 carbon atoms for forming a ring, or a substituted or unsubstituted heteroaryl group having 1 to 30 carbon atoms for forming a ring, and any of $R_{21}$ to $R_{27}$ are optionally combined with an adjacent group to form a ring.

15. The organic electroluminescence device of claim 14, wherein Formula 1 is represented by Formula 1-1:

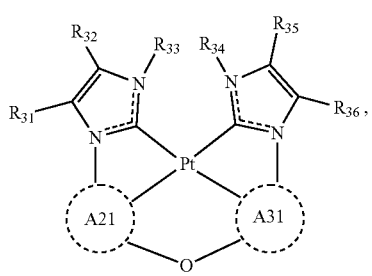

Formula 1-1 wherein, in Formula 1-1,

A21 and A31 are each independently LG1 or LG3, and at least one selected from A21 and A31 is LG3, and $R_{31}$ to $R_{36}$ are each independently a hydrogen atom, a deuterium atom, a substituted or unsubstituted alkyl group having 1 to 20 carbon atoms, a substituted or unsubstituted aryl group having 6 to 30 carbon atoms for forming a ring, or a substituted or unsubstituted heteroaryl group having 1 to 30 carbon atoms for forming a ring, and any of $R_{31}$ to $R_{36}$ are optionally combined with an adjacent group to form a ring.

16. The organic electroluminescence device of claim 14, wherein Formula 2 is represented by Formula 2-1 or Formula 2-2:

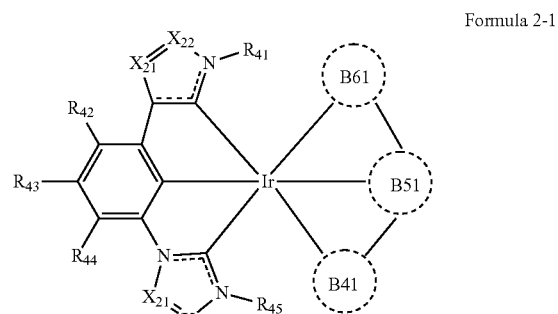

Formula 2-1

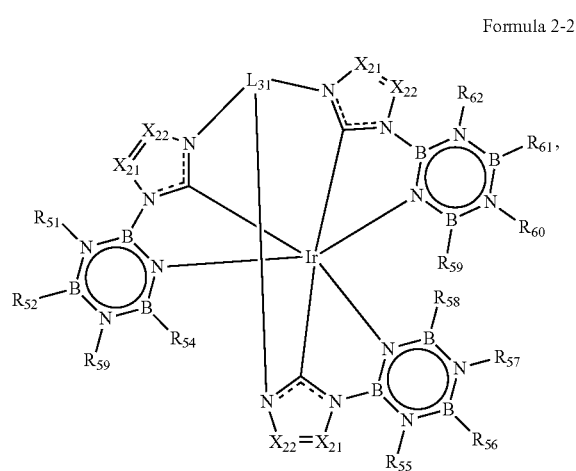

Formula 2-2 in Formula 2-1 and Formula 2-2

B41 to B61 are each independently LG1, LG2, or LG3, and at least one selected from B41 to B61 is LG3, $R_{41}$ to $R_{45}$ are each independently a hydrogen atom, a deuterium atom, a substituted or unsubstituted alkyl group having 1 to 20 carbon atoms, a substituted or unsubstituted aryl group having 6 to 30 carbon atoms for forming a ring, or a substituted or unsubstituted heteroaryl group having 1 to 30 carbon atoms for forming a ring, and any of $R_{41}$ to $R_{45}$ are optionally combined with an adjacent group to form a ring, $R_{51}$ to $R_{62}$ are each independently a hydrogen atom, a deuterium atom, a substituted or unsubstituted alkyl group having 1 to 20 carbon atoms, a substituted or unsubstituted aryl group having 6 to 30 carbon atoms for forming a ring, or a substituted or unsubstituted heteroaryl group having 1 to 30 carbon atoms for forming a ring, and any of $R_{51}$ to $R_{62}$ are optionally combined with an adjacent group to form a ring, $L_{31}$ is the same as defined in Formula 2A, and $X_{21}$ and $X_{22}$ are the same as defined in LG2.

17. An organometallic compound represented by Formula 1 or Formula 2:

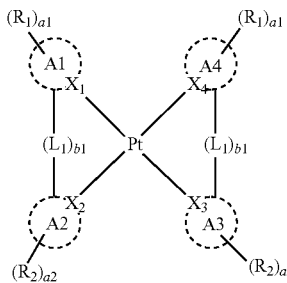

Formula 1

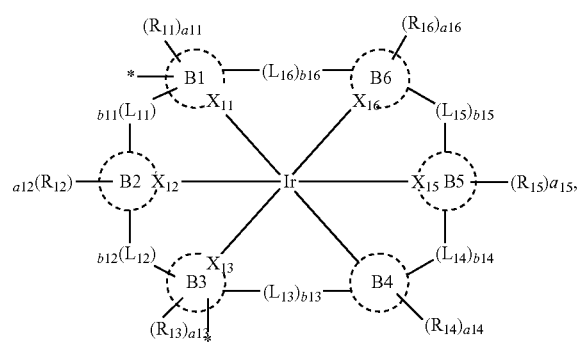

Formula 2 wherein, in Formula 1 and Formula 2, $X_1$ to $X_4$ and $X_{11}$ to $X_{16}$ are each independently a carbon atom or a nitrogen atom, A1 to A4 and B1 to B6 are each independently a substituted or unsubstituted aryl group having 6 to 30 carbon atoms for forming a ring, or a substituted or unsubstituted heteroaryl group having 1 to 30 carbon atoms for forming a ring, at least one selected from A1 to A4, and at least one selected from B1 to B6, are a substituted or unsubstituted borazine group, $R_1$ to $R_4$ and Ru to $R_{16}$ are each independently a hydrogen atom, a deuterium atom, a substituted or unsubstituted alkyl group having 1 to 20 carbon atoms, a substituted or unsubstituted aryl group having 6 to 30 carbon atoms for forming a ring, or a substituted or unsubstituted heteroaryl group having 1 to 30 carbon atoms for forming a ring, and any of $R_1$ to $R_4$ and Ru to $R_{16}$ are optionally combined with an adjacent group to form a ring, a1 to a4 and a11 to a16 are each independently an integer of 0 to 3, $L_1$ to $L_3$ and $L_{11}$ to $L_{16}$ are each independently a direct linkage, *—O—*, *—S—*, a substituted or unsubstituted divalent alkyl group having 1 to 20 carbon atoms, a substituted or unsubstituted arylene group having 6 to 30 carbon atoms for forming a ring, or a substituted or unsubstituted heteroarylene group having 1 to 30 carbon atoms for forming a ring, b1 to b3 and b11 to b16 are each independently 0 or 1, and in Formula 2, B1, B3, and B6 are optionally linked to a linker represented by Formula 2A:

Formula 2A wherein, in Formula 2A, $L_{31}$ is a nitrogen atom, a substituted or unsubstituted trivalent alkyl group having 1 to 20 carbon atoms, a substituted or unsubstituted trivalent aryl group having 6 to 30 carbon atoms for forming a ring, or a substituted or unsubstituted trivalent heteroaryl group having 1 to 30 carbon atoms for forming a ring, and c is 0 or 1.

18. The organometallic compound of claim 17, wherein A1 to A4, and B1 to B6 are each independently any one selected from selected from LG1 to LG3:

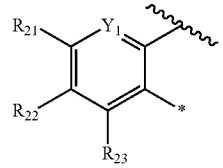

LG1

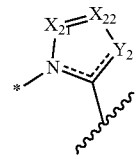

LG2

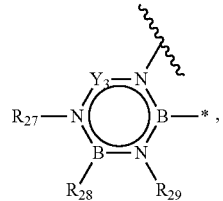

LG3 wherein, in LG1 to LG3, $X_{21}$ and $X_{22}$ are each independently $CR_{24}$, or a nitrogen atom, $Y_1$ is $CR_{25}$ or C—*, $Y_2$ is $NR_{26}$ or N—, $Y_3$ is B or B—*, and $R_{21}$ to $R_{29}$ are each independently a hydrogen atom, a deuterium atom, a substituted or unsubstituted alkyl group having 1 to 20 carbon atoms, a substituted or unsubstituted aryl group having 6 to 30 carbon atoms for forming a ring, or a substituted or unsubstituted heteroaryl group having 1 to 30 carbon atoms for forming a ring, and any of $R_{21}$ to $R_{29}$ are optionally combined with an adjacent group to form a ring.

19. The organometallic compound of claim 18, wherein Formula 1 is represented by Formula 1-1:

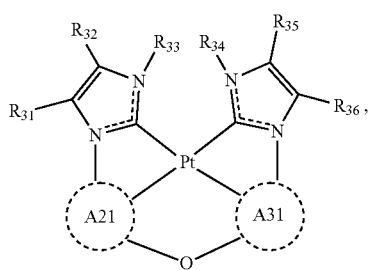

Formula 1-1 wherein, in Formula 1-1,

A21 and A31 are each independently LG1 or LG3, and at least one selected from A21 and A31 is LG3, and $R_{31}$ to $R_{36}$ are each independently a hydrogen atom, a deuterium atom, a substituted or unsubstituted alkyl group having 1 to 20 carbon atoms, a substituted or unsubstituted aryl group having 6 to 30 carbon atoms for forming a ring, or a substituted or unsubstituted heteroaryl group having 1 to 30 carbon atoms for forming a ring, and any of $R_{31}$ to $R_{36}$ are optionally combined with an adjacent group to form a ring.

20. The organometallic compound of claim 18, wherein Formula 2 is represented by Formula 2-1 or Formula 2-2:

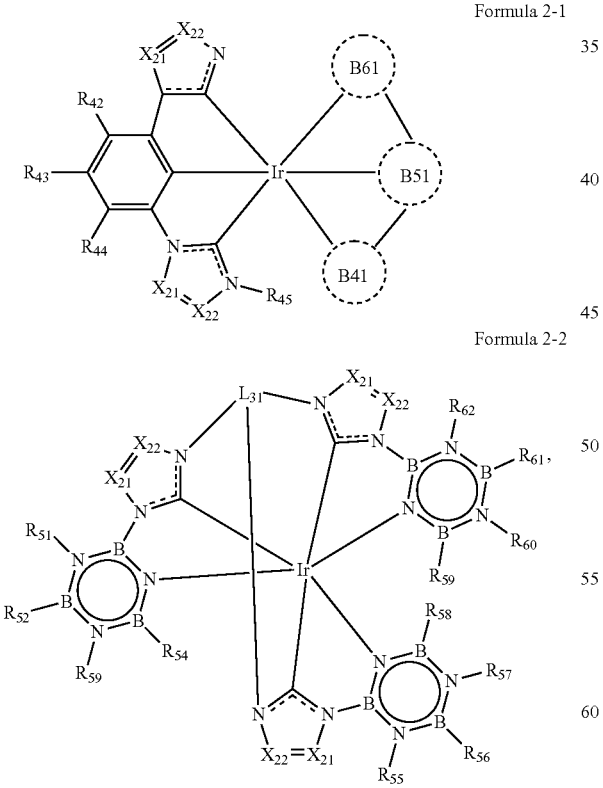

Formula 2-1

Formula 2-2 wherein in Formula 2-1 and Formula 2-2,

B41 to B61 are each independently LG1, LG2, or LG3, and at least one selected from B41 to B61 is LG3, $R_{41}$ to $R_{45}$ are each independently a hydrogen atom, a deuterium atom, a substituted or unsubstituted alkyl group having 1 to 20 carbon atoms, a substituted or unsubstituted aryl group having 6 to 30 carbon atoms for forming a ring, or a substituted or unsubstituted heteroaryl group having 1 to 30 carbon atoms for forming a ring, and any of $R_{41}$ to $R_{45}$ are optionally combined with an adjacent group to form a ring, $R_{51}$ to $R_{62}$ are each independently a hydrogen atom, a deuterium atom, a substituted or unsubstituted alkyl group having 1 to 20 carbon atoms, a substituted or unsubstituted aryl group having 6 to 30 carbon atoms for forming a ring, or a substituted or unsubstituted heteroaryl group having 1 to 30 carbon atoms for forming a ring, and any of $R_{51}$ to $R_{62}$ are optionally combined with an adjacent group to form a ring, $L_{31}$ is the same as those in Formula 2A, and $X_{21}$ and $X_{22}$ are the same as defined in LG2.

21. The organometallic compound of claim 17, wherein a difference ($\Delta(T_1-{}^3MC)$) between $T_1$ energy level and $^3MC$ energy level of the organometallic compound is about 0.3 eV or more.

22. The organometallic compound of claim 17, wherein Formula 1 is any one selected from compounds represented by Compound Group 1:

Compound Group 1

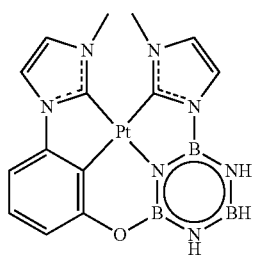

1

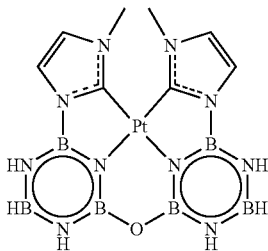

2

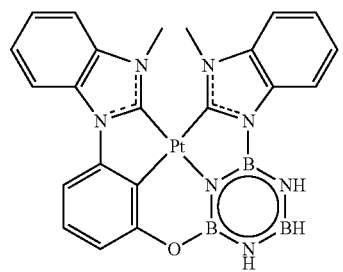

3

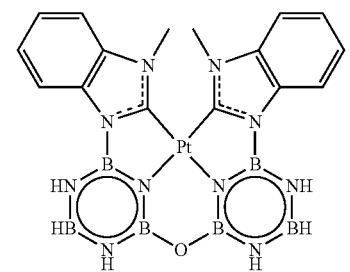
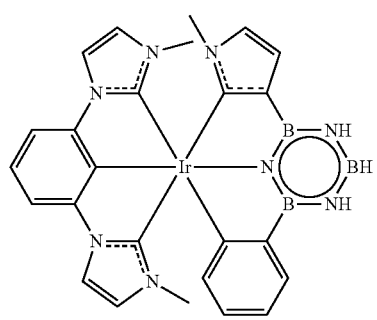
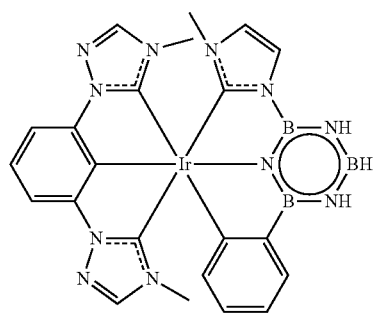
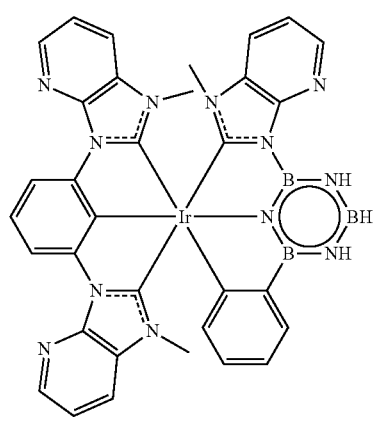
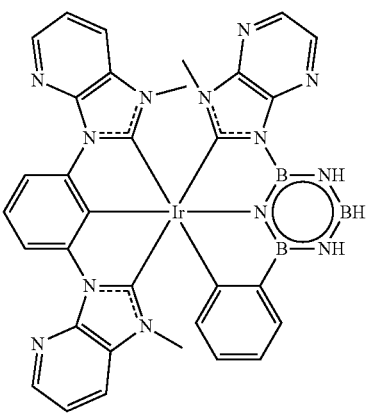
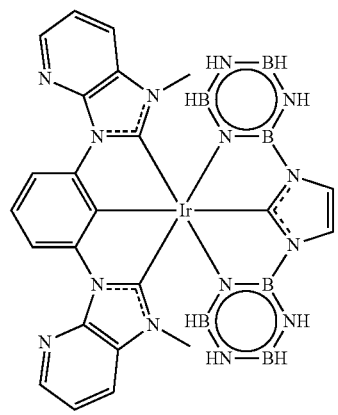
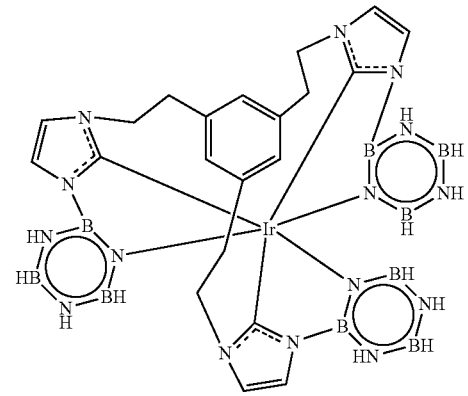
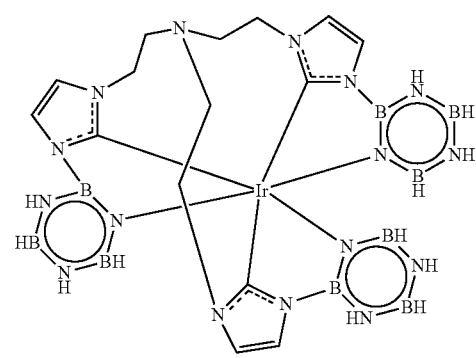

12
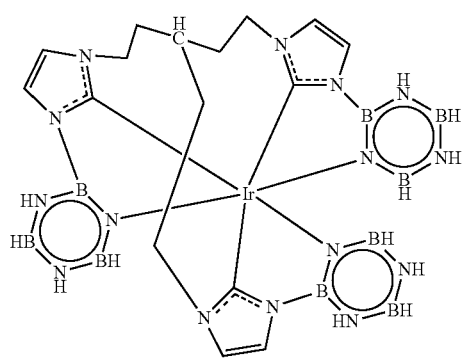
13
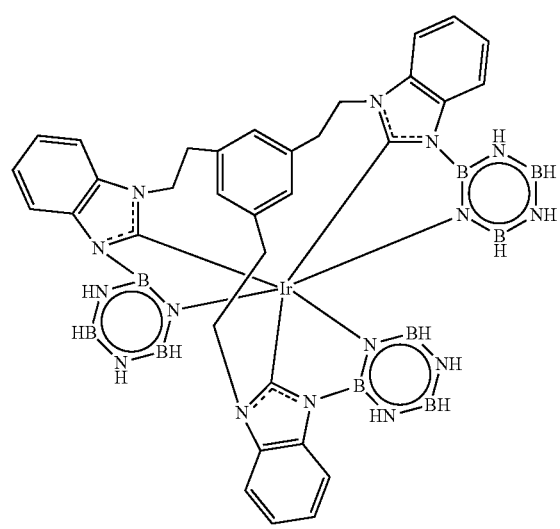
14
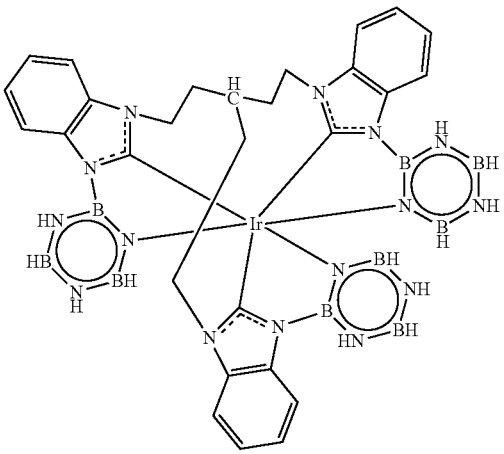
15
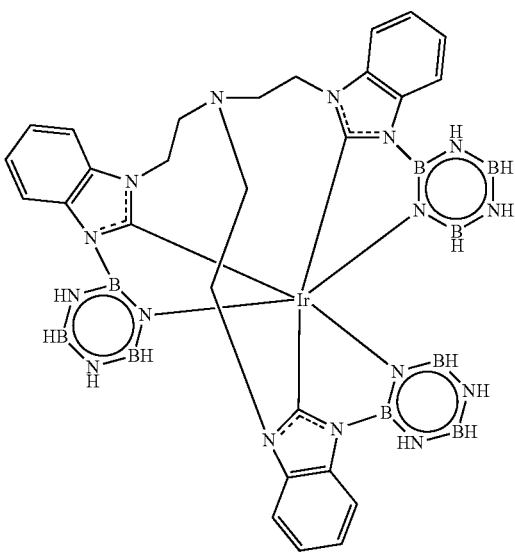
* * * * *